(12) United States Patent
Maschmeyer et al.

(10) Patent No.: US 8,780,060 B2
(45) Date of Patent: Jul. 15, 2014

(54) METHODS AND SYSTEMS FOR PROVIDING HAPTIC CONTROL

(75) Inventors: Russell Maschmeyer, Brooklyn, NY (US); Gordon Cameron, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 796 days.

(21) Appl. No.: 12/938,305

(22) Filed: Nov. 2, 2010

(65) Prior Publication Data

US 2012/0105333 A1    May 3, 2012

(51) Int. Cl.
*G06F 3/041*    (2006.01)
(52) U.S. Cl.
USPC ............................. 345/173; 345/156
(58) Field of Classification Search
USPC ................................. 345/156–173
See application file for complete search history.

(56) References Cited

U.S. PATENT DOCUMENTS

| | | | |
|---|---|---|---|
| 5,212,473 A | 5/1993 | Louis | |
| 5,982,304 A | 11/1999 | Selker et al. | |
| 6,218,966 B1 | 4/2001 | Goodwin et al. | |
| 6,337,678 B1 | 1/2002 | Fish | |
| 6,354,839 B1 | 3/2002 | Schmidt et al. | |
| 6,819,312 B2 | 11/2004 | Fish | |
| 7,106,305 B2 | 9/2006 | Rosenberg | |
| 7,148,875 B2 | 12/2006 | Rosenberg et al. | |
| 7,230,190 B1 | 6/2007 | Kwong et al. | |
| 7,245,292 B1 | 7/2007 | Custy | |
| 7,326,864 B2 | 2/2008 | Conzola et al. | |
| 7,336,260 B2 | 2/2008 | Martin et al. | |
| 7,382,357 B2 | 6/2008 | Panotopoulos et al. | |
| 7,450,110 B2 | 11/2008 | Shahoian et al. | |
| 7,468,573 B2 | 12/2008 | Dai et al. | |
| 7,548,232 B2 | 6/2009 | Shahoian et al. | |
| 7,688,310 B2 | 3/2010 | Rosenberg | |
| 7,728,820 B2 | 6/2010 | Rosenberg et al. | |
| 7,741,979 B2 | 6/2010 | Schlosser et al. | |
| 7,769,417 B2 | 8/2010 | Tierling et al. | |
| 2005/0030292 A1* | 2/2005 | Diederiks | 345/173 |
| 2005/0057528 A1* | 3/2005 | Kleen | 345/173 |
| 2007/0229233 A1* | 10/2007 | Dort | 340/407.1 |
| 2007/0247420 A1 | 10/2007 | Strohband et al. | |
| 2008/0010593 A1 | 1/2008 | Uusitalo et al. | |
| 2008/0100177 A1* | 5/2008 | Dai et al. | 310/317 |

(Continued)

FOREIGN PATENT DOCUMENTS

| | | |
|---|---|---|
| DE | 10128908 | 12/2002 |
| DE | 102004005501 | 8/2005 |
| EP | 893297 | 11/2003 |
| WO | WO2005015376 | 2/2005 |

OTHER PUBLICATIONS

APC International, Ltd., Piezoelectric Ceramics: Principles and Applications, pp. 44-107 (2002).

*Primary Examiner* — Viet Pham
(74) *Attorney, Agent, or Firm* — Brownstein Hyatt Farber Schreck, LLP

(57) ABSTRACT

Haptic systems are disclosed which may provide increased resolution in tactile feedback. A tiered haptic system may be formed by stacking of haptic elements. One or more arrays of shape change elements such as, for example, piezoelectric elements may be used to actuate a screen surface. Arrays may also be used to sense tactile interactions and stimuli on a screen surface. An embedded haptic system may be formed by inserting haptic elements into a contoured elastic sheet. The embedded haptic system may provide tactile interactions to a user. In some embodiments, both tiered and embedded haptic arrangements may be used.

19 Claims, 7 Drawing Sheets

(56) References Cited

U.S. PATENT DOCUMENTS

| | | | |
|---|---|---|---|
| 2008/0251364 A1* | 10/2008 | Takala et al. | 200/341 |
| 2008/0303796 A1* | 12/2008 | Fyke | 345/173 |
| 2009/0149977 A1* | 6/2009 | Schendel | 700/98 |
| 2009/0195512 A1 | 8/2009 | Pettersson | |
| 2009/0210568 A1 | 8/2009 | Peterson et al. | |
| 2009/0250267 A1* | 10/2009 | Heubel et al. | 178/18.03 |

* cited by examiner

METHODS AND SYSTEMS FOR PROVIDING HAPTIC CONTROL

The present disclosure is directed towards haptic controls. More particularly, the present disclosure is directed, in some embodiments, towards multi-tiered haptic controls.

BACKGROUND

Tactile feedback systems provide a user with the ability to interact with a subsystem through touch or contact. Haptic systems facilitate these tactile interactions by using actuators, sensors, or both. Haptic systems are commonly used in robotics, video games (e.g., "rumbling" as used in some video game controllers), and other interactive systems which allow interaction via touch. An array of haptic elements is commonly used to provide touchscreen technology to users.

The scale of the haptic elements used affects tactile feedback. Large elements may be capable of achieving larger displacements and forces relative to smaller elements while sacrificing resolution. Small elements may be able to provide finer resolution for haptic response, relative to larger elements, but may sacrifice displacement and force. It would be desirable to provide a haptic system that is capable of providing sufficient displacements and forces at acceptable resolutions for haptic response.

SUMMARY

This disclosure relates to systems and methods for providing haptic response. The disclosed haptic response approaches may be implemented using any suitable software, hardware, or both. In some embodiments, the disclosed haptic response approach may use one or more arrays of shape change elements to provide a wide range of tactile feedback. Each shape change element, in each array, may be coupled to a control circuit, which may use any suitable type of control signal for actuation, sensing, feedback, or suitable combinations thereof.

DETAILED DESCRIPTION

Figure 1:
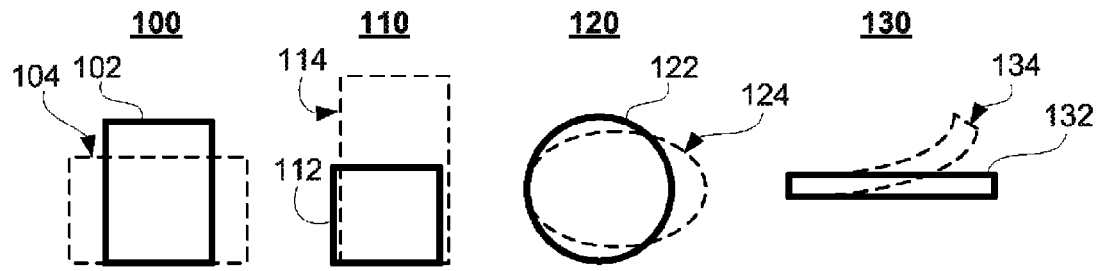
FIG. 1 is a diagram of illustrative shape change elements in accordance with some embodiments of the present disclosure.

The present disclosure is directed to systems and methods for providing layered haptic controls. Haptic systems may be used for actuation such as vibration, shape change (e.g., contouring a flat surface), or other suitable actuations or combination of actuations which may provide tactile feedback to a user. Haptic systems may also be used for sensing stimuli such as, for example, contact on a display screen, patterns of contact on a screen, shape changes, physical changes of a system or component, or other suitable stimuli or combinations of stimuli which may be received. Haptic systems may sense particular stimuli, change one or more characteristics of a shape change element, or both. Haptic systems may perform sensing functions and actuating functions at the same time. In some embodiments, haptic systems may be coupled to a display screen, audio system, device software, device hardware or other system to provide for any combination of tactile, visual, and audio interactions. Actuation may occur, in some embodiments, substantially normal to a substantially planar surface, which may allow for three dimensional contouring of the planar surface.

In some embodiments, shape change elements may have different properties which may provide for relatively different responses. For example, shape change elements of a particular size may provide for a particular range of displacement, force, sensing any other suitable physical response, or any combinations thereof. Shape change elements of relatively smaller size may provide finer resolution in displacement, force, sensing any other suitable physical response, or any combinations thereof. Shape change elements of relatively larger size may provide coarser resolution in displacement, force, sensing any other suitable physical response, or any combinations thereof. Various scales of haptic response may be used to provide diverse tactile interaction. For example, large displacements may be achieved by using one or more arrays of relatively large shape change elements. One or more arrays of relatively small shape change elements may be stacked with the one or more arrays of larger elements to provide for finer haptic response while allowing for large displacements. In some embodiments, multiple layers of arrays may be used, which each may have a particular size of shape change elements. Such arrangements may allow for varied response over large temporal and spatial ranges of tactile response and interaction.

In some embodiments, a tiered haptic response approach may be used in which one or more arrays of shape change elements may provide tactile interaction via an elastic screen interface. A suitable display screen may be included in the elastic screen interface. For example, stacked, planar arrays of piezoelectric elements may be used to provide variable actuation, sensing, or both. In some arrangements, each array may include, for example, piezoelectric elements of a particular size, providing multi-scale control in actuation and sensing. In some arrangements, a particular type of shape change element may be included in each array. In some embodiments, different types of shape change elements may be included within a particular array. Shape change elements may provide any type of actuation such as, for example, vibration, net displacement, bending, deforming, any other suitable actuation mode, or any suitable combinations thereof.

For example, a stacked haptic arrangement may include a particular array, which may include electromechanical elements (e.g., solenoids). Another array in the stacked haptic arrangement may include electroactive polymer elements. The shape change elements of the arrays of this illustrative stacked haptic arrangement may be controlled by any suitable control system, which may include circuitry for activating electromechanical actuators, electroactive polymers, or both. Stacked arrays may be used to create a contoured screen surface such as, for example, contour maps, shaped buttons, moving contours or shapes, or other surfaces with multi-scale features. In some embodiments, the stacked haptic arrangement may receive tactile stimuli on the screen surface. This stimuli may be received at any suitable time, including times when one or more shape changes elements of one or more arrays are activated.

For example, a stacked haptic arrangement may include one or more shape change elements of one or more arrays that may be activated to produce one or more screen surface features. The stacked haptic arrangement may receive a stimulus from software (e.g., software command), hardware (e.g., a stylus), a user (e.g., finger contact), any other suitable source, or any suitable combinations thereof. In some embodiments, a tactile interaction between a user and a device may be detected, processed, or both. The stacked haptic arrangement may receive a stimulus such as, for example, a touch by a user on some portion of the surface feature. The haptic arrangement may, in response to the tactile stimulus, execute one or more functions associated with the surface feature. For example, a stacked haptic arrangement may form a raised button corresponding to a particular media selection (e.g., a song in an iTunes® library) on the screen surface. In response to receiving a user selection of the button (e.g., touching the raised button), the stacked haptic arrangement may play the media selection. In a further example, a stacked haptic arrangement may form a contour map of a particular geological location on the screen surface. The stacked haptic arrangement may receive a particular tactile stimulus (e.g., user contact) to a particular region of the screen surface corresponding to a particular geographic region. In response to the tactile stimulus, the stacked haptic arrangement may reconfigure the screen surface to, for example, form a scaled contour map of the particular geographic region. The stacked haptic arrangement may form any suitable surface feature or contour on the screen surface, and may receive any suitable stimuli on the screen surface.

In some embodiments, an embedded haptic arrangement may be used in which one or more arrays of shape change elements may be embedded or inserted in an elastic screen interface. For example, an array of shape change elements embedded within an elastic screen sheet may be used to provide variable actuation, sensing, or both. In some embodiments, the elastic screen sheet may include one or more sunken reliefs (e.g., blind holes, patterned grooves, etched surfaces) or cavities (e.g., etched cavities, internal cavities), in which shape change elements may be positioned. In some arrangements, an elastic screen sheet may include one or more arrays of shape change elements, which may vary in size and shape. In some arrangements, in which more than one array is used, a particular type of shape change element may be included in each array. In some arrangements, within a particular array there may be different types of shape change elements of any suitable size or shape.

In some embodiments, an embedded haptic arrangement may be combined with a stacked haptic arrangement. For example, a stacked haptic arrangement may include one or more arrays of shape change elements and an elastic screen sheet that may include embedded shape change elements. The disclosed haptic arrangements may include any suitable combination of shape change elements and elastic sheets to provide tactile interaction.

Although piezoelectric elements may be referred to herein in examples and discussion for purposes of brevity and clarity, it will be understood that any suitable shape change element or combination of elements may be used in accordance with the present disclosure. Shape change elements may include piezoelectrics, shape memory alloys, shape memory polymers, electroactive polymers, electromechanical actuators (e.g., rotary motors, linear motors), mechanical actuators, pneumatic actuators, any other suitable actuators, or any suitable combinations thereof. Shape change elements may be controlled by any suitable control approach including, for example, direct-current (DC) actuation, alternating-current (AC) actuation, biased AC actuation (e.g., AC-DC coupling), pulsed DC actuation (e.g., pulsed width modulation), any other suitable electronic signal or waveform, optic actuation (e.g., ultraviolet activation), thermal actuation (e.g., temperature control), hydraulic actuation (e.g., liquid pressure control), pneumatic actuation (e.g., gas pressure control), any other suitable control approach or any suitable combinations or super-positions thereof. Shape change elements may be used as sensors which may send suitable signals to control circuitry such as, for example, modulated waveforms. In some embodiments, signals may include voltages (e.g., DC, AC, biased AC), changes in voltage, forces, pressures, changes in pressure, stresses, changes in stress, strain, changes in strain, any other suitable signal or output, or any suitable combinations thereof.

The present disclosure is described more fully in the context of FIGS. 1-21 below.

FIG. 1 is a schematic diagram of illustrative shape change elements 100, 110, 120, an 130, in accordance with some embodiments of the present disclosure. The shape change elements of FIGS. 1-5 are illustrative, and are not meant to limit the scope of the present disclosure. The phrase "shape change element" as used herein describes materials, components or assemblies which may undergo a change in shape or one or more spatial dimensions in response to a control stimulus. The term "activation" as used herein describes the process of applying a control stimulus to a shape change element causing a shape change, vibration (e.g., periodic shape change), force, or other suitable physical response. Shape change elements, when not activated, may be in an un-activated state, which may or may not include one or more control stimuli.

Shape change element 100 with initial shape 102 may undergo activation to final shape 104. Shape change element 100 may undergo an isochoric process, in which the volume of element 100 remains substantially constant while the shape of element 100 may change. In some arrangements, shape change element 100 may change spatial dimension in several directions when activated. For example, in some embodiments, shape change element 100 may be cylindrical, and upon activation may grow in axial dimension and reduce in diametric dimension. Shape change element 100 may vibrate in any direction or combination of directions in response to suitable activation such as, for example, an AC electronic signal. For example, shape change element 100 may be a piezoelectric element.

Shape change element 110 with initial shape 112 may undergo activation to final shape 114. Shape change element 110 may undergo an non-isochoric process, in which the volume of element 110 changes during activation. In some arrangements, shape change element 110 may change spatial dimension substantially in only one direction when activated. For example, in some embodiments, shape change element 110 may be cylindrical, and upon activation may grow in axial dimension and maintain a fixed diametric dimension. In some embodiments, shape change element 110 may vibrate in a particular direction in response to suitable activation such as, for example, an AC electronic signal or pulsating pressure drive. For example, shape change element 110 may be a electromechanical element such as a linear solenoid, or a mechanical element such as a piston/cylinder arrangement.

Shape change element 120 with initial shape 122 may undergo activation to final shape 124. In some arrangements, shape change element 120 may change spatial dimension substantially in one or more directions. For example, in some embodiments, shape change element 120 may have spherical shape 122, and upon activation may deform to ellipsoidal shape 124. In some embodiments, shape change element 120 may vibrate in any direction or combination of directions in response to suitable activation such as, for example, an AC electronic signal. For example, shape change element 120 may be an electroactive polymer or shape memory polymer.

Shape change element 130 with initial shape 132 may undergo activation to final shape 134. In some arrangements, shape change element 130 may change spatial dimension substantially in one or more directions. For example, in some embodiments, shape change element 130 may have rectangular bar shape 132, and upon activation may deform to curved bar shape 134. In some embodiments, shape change element 130 may vibrate as a cantilever in response to suitable activation such as, for example, an AC electronic signal. For example, shape change element 130 may be an electroactive polymer or shape memory polymer. In a further example, shape change element 130 may be a piezoelectric element with rigidly fixed ends (e.g., similar to the shape change elements of FIGS. 4-5).

Figure 2:
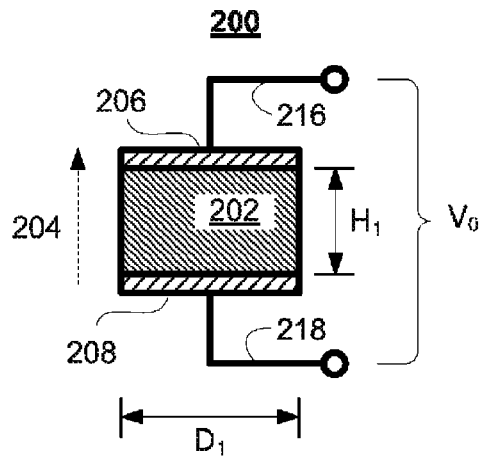
FIG. 2 is a diagram of an illustrative un-activated shape change element in accordance with some embodiments of the present disclosure.

FIG. 2 is a diagram of illustrative un-activated shape change component 200 in accordance with some embodiments of the present disclosure. Shape change component 200 may include shape change element 202, leads 206 and 208, and control leads 216 and 218. Control leads 216 and 218, and leads 206 and 208, may correspond to any suitable control system including, for example, electrodes for electronic signals or waveforms, fiber optics (e.g., ultraviolet activation), electrodes for heating elements (e.g., temperature control), pressure lines (e.g., liquid pressure control, gas pressure control), any other suitable control system or any suitable combinations or superpositions thereof. In some embodiments, shape change component 200 may include only one control lead, although any suitable number of control leads may be used. Shape change element 202 may include preferred direction 204 which may point along any suitable axis or direction. In some embodiments, preferred direction 204 may correspond substantially to a direction of polarization (e.g., axis of dipole alignment in a piezoelectric material). In some embodiments, preferred direction 204 may correspond to an axis of linear movement such as, for example, the motion of a piston-cylinder device or linear actuator. In the illustrative example of FIG. 2, shape change component 200 may be cylindrical with axial length "$H_1$" and diameter "$D_1$". A base control signal "$V_0$" may be applied to shape change component 200. In some embodiments, "$V_0$" may correspond to the un-activated state, and have a value of zero in suitable units (e.g., zero potential difference between leads 206 and 208, zero pressure difference between leads 206 and 208). In some embodiments, "$V_0$" may correspond to an un-activated state, and have a nonzero value in suitable units (e.g., nonzero potential difference between leads 206 and 208, nonzero pressure difference between leads 206 and 208). For example, in some embodiments, shape change element 200 may be a piezoelectric element, and "$V_0$" may represent a nonzero polarization voltage (e.g., 1000 VDC), which may be applied to maintain polarization of, but not substantially activate, element 202. In a further example, in some embodiments, shape change component 200 may be a pneumatic piston-cylinder arrangement, and "$V_0$" may represent a gage pressure (e.g., psig) of zero, which may be applied to maintain an un-activated state of element 202. Base control signal "$V_0$" may be any suitable value, in any suitable units, for maintaining shape change element 202 in a substantially un-activated state. In some embodiments, shape change component 200 may be rigidly affixed to a rigid frame or substrate at one or more points or regions of contact.

Figure 3:
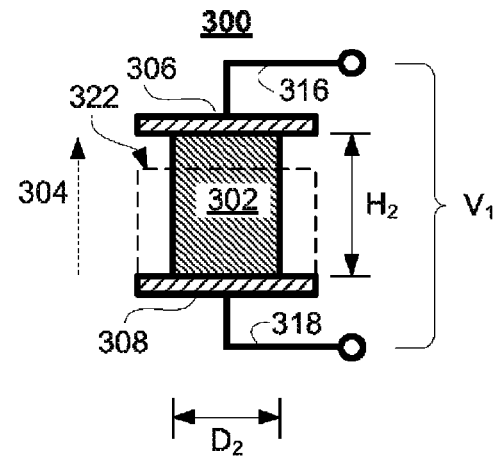
FIG. 3 is a diagram of an illustrative activated shape change element in accordance with some embodiments of the present disclosure.

FIG. 3 is a diagram of illustrative activated shape change component 300 in accordance with some embodiments of the present disclosure. Shape change component 300 may include shape change element 302, leads 306 and 308, and control leads 316 and 318. Leads 306 and 308, and control leads 316 and 318, may correspond to any suitable control system. In some embodiments, the activated state of shape change element 302 may correspond to an activated state of un-activated shape change element 202, as shown by dotted outline 322 corresponding to the dimensions of element 202.

Activation direction 304 may correspond substantially with preferred direction 204 of FIG. 2. In the illustrative example of FIG. 3, shape change component 300 may be substantially cylindrical with axial length "$H_2$" and diameter "$D_2$".

An activation control signal "$V_1$" may be applied to shape change element 302. Activation control signal "$V_1$" may activate shape change element 302 to form the illustrative cylindrical shape with axial length "$H_2$" and diameter "$D_2$". In some embodiments, "$V_1$" may correspond to an activated state, and have a nonzero value in suitable units relative to the un-activated state. In some embodiments, "$V_1$" may correspond to an activated state, and have a fluctuating value in suitable units (e.g., biased AC potential difference between control leads 306 and 308).

In some embodiments, shape change element 302 may have more than one activated state, which may correspond to one or more types of control signal. For example, a piezoelectric shape change element may be activated in a vibration state by the application of, for example, AC voltage, with suitable amplitude and frequency, to leads 306 and 308. The piezoelectric shape change element may also be activated in a net-displacement vibration state by the application of, for example, biased AC (e.g., coupled AC and DC) voltage, with suitable amplitude, frequency and DC offset, to leads 306 and 308. Any suitable control stimuli or signal may be used to activate shape change element 302 in any suitable activation mode. Shape change element 302 may undergo shape change, relative to an un-activated state, in activation direction 304. Shape change element 302 may undergo shape change, relative to an un-activated state, in directions other than activation direction 304 such as during, for example, isochoric shape changes. In some embodiments, shape change component 300 may be rigidly affixed to a rigid frame or substrate at one or more points or regions of contact.

Figure 4:
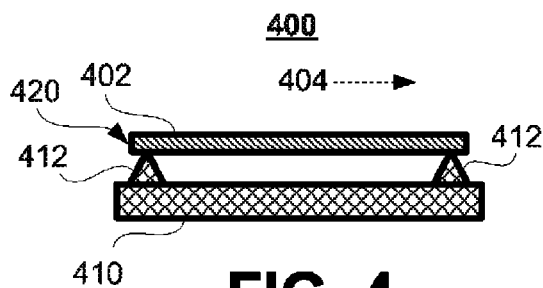
FIG. 4 is a diagram of an illustrative shape change element affixed at each end in accordance with some embodiments of the present disclosure.

FIG. 4 is a diagram of illustrative un-activated shape change component 400 in accordance with some embodiments of the present disclosure. Shape change component 400 may include shape change element 402, rigid base 410, and one or more rigid mounts 412. Although not shown, shape change component 400 may include one or more control leads positioned in contact with shape change element 402 such as, for example, on surface 420 and the surface opposite to surface 420. In some embodiments, shape change element 402 may have preferred direction 404, which may be oriented along any suitable direction. For example, illustrative shape change element 402 may be a piezoelectric bar element, polarized in direction 404, which may be directed along the length of element 402. Shape change element 402 may be rigidly fixed at both ends by rigid mounts 412. Rigid mounts 412 may include mechanical clamps (e.g., wedged components, screw-down clamps, sleeves), adhesive bonds (e.g., glued connections), any other suitable mounting technique or any suitable combination thereof.

Figure 5:
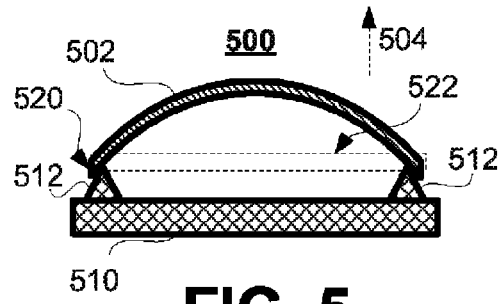
FIG. 5 is a diagram of an illustrative activated shape change element in a bending mode in accordance with some embodiments of the present disclosure.

FIG. 5 is a diagram of illustrative activated shape change element 500 in accordance with some embodiments of the present disclosure. Shape change component 500 may include shape change element 502, rigid base 510, and one or more rigid mounts 512. Although not shown, shape change component 500 may include one or more leads positioned in contact with shape change element 502 such as, for example, on surface 520 and the surface opposite to surface 520. In some embodiments, the activated state of shape change element 502 may correspond to an activated state of un-activated shape change element 402, as shown by dotted outline 522 corresponding to the dimensions of element 402. Activated shape change element 500 may have increased length relative to un-activated state, which may cause bending of element 500 in the activated state due to rigid mounts 512.

Activation direction 504 may be different than preferred direction 404 of FIG. 4, as shown in FIG. 5. Shape change elements may be constrained in any suitable way to control motion or shape when activated or un-activated. For example, shape change elements may be fixed at a single point, multiple points, or may remain unfixed at all points. In a further example, shape change elements may be constrained by a normal force that does not fix position but restricts movement such as, for example, clamping in one direction while allowing two dimensional translation. Any suitable techniques, components, or arrangements for fixing or constraining shape change elements may be used in accordance with the present disclosure.

Figure 6:
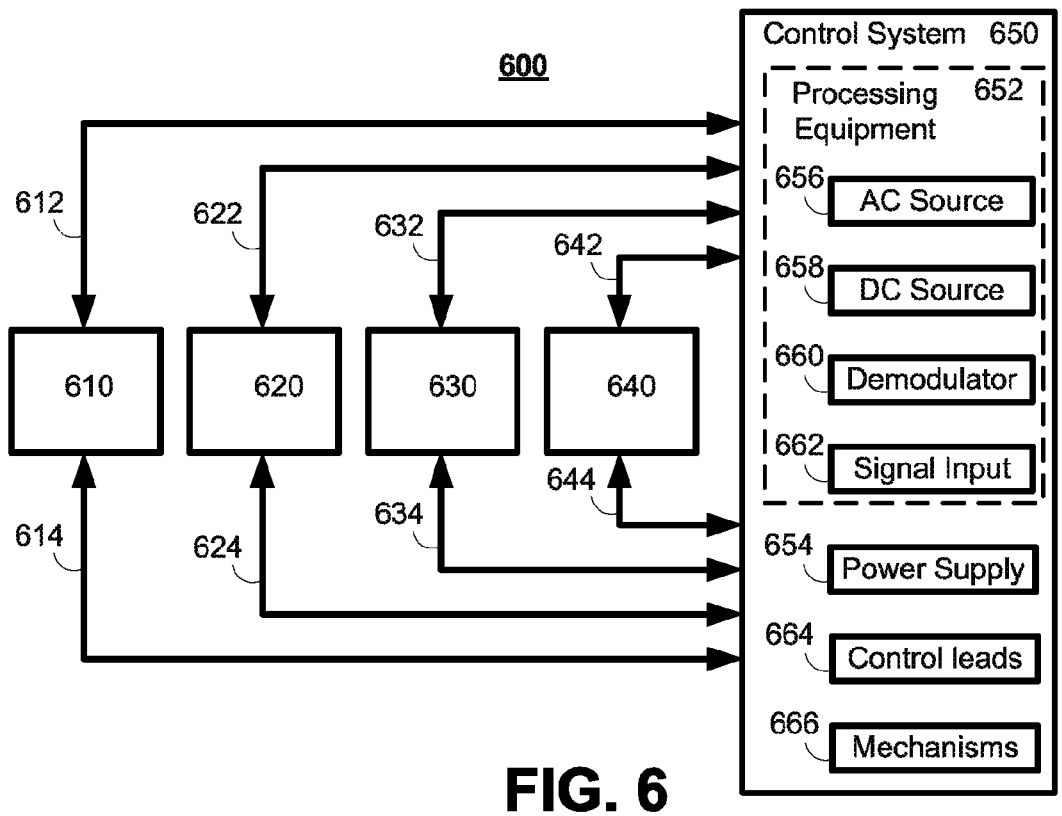
FIG. 6 is a schematic diagram of illustrative shape change elements and a control system in accordance with some embodiments of the present disclosure.

FIG. 6 is a diagram of illustrative haptic system 600 which may include shape change elements 610, 620, 630, and 640, which may be controlled by control system 650 in accordance with some embodiments of the present disclosure. In some embodiments, shape change elements 610, 620, 630, and 640 may form one or more arrays. Although four exemplary shape change elements are shown in FIG. 6, control system 650 may control any suitable number of shape change elements, arranged in any suitable number of arrays. The term "array" as used herein shall refer to collections of one or more shape change elements that may be grouped for convenience. For example, an array may include a five by five planar grid of twenty five shape change elements. An array may include collections of elements grouped in any suitable manner, which may be random, patterned, or some combination of random and patterned arrangements. Haptic system 600 may be included in any suitable device or system such as, for example, a personal communications device, a personal media device, a computer, an automatic teller machine (ATM), an industrial process control interface, automated interfaces (e.g., automated airline boarding pass systems, automated movie ticket kiosks), any other suitable device, system or interface which may use haptic response, or any suitable combination thereof.

Shape change elements 610, 620, 630, and 640 may include piezoelectrics, shape memory alloys, shape memory polymers, electroactive polymers, electromechanical actuators (e.g., rotary motors, linear motors), mechanical actuators, pneumatic actuators, hydraulic actuators, any other suitable actuators, or any suitable combinations thereof.

Shape change elements 610, 620, 630, and 640 may be coupled to control system 650 by control leads 612 and 614, 622 and 624, 632 and 634, and 642 and 644, respectively. Shape change elements may be controlled by any suitable control approach including DC control, AC control (e.g., sinusoidal voltage, summed sinusoidal voltages), biased AC control (e.g., AC-DC coupling), pulsed DC control (e.g., PWM), any other suitable electronic signal or waveform, optic control (e.g., ultraviolet activation), thermal control (e.g., temperature control), hydraulic control (e.g., liquid pressure control), pneumatic control (e.g., gas pressure control), any other suitable control approach or any suitable combinations or super-positions thereof.

Control leads 612, 614, 622, 624, 632, 634, 642 and 644 may correspond to coupling leads for any suitable control system including, for example, wires and electrodes for electronic signals or waveforms, fiber optics for optical control (e.g., ultraviolet activation), wires and electrodes for heating elements (e.g., for temperature control), pressure lines and fittings (e.g., for liquid pressure control, gas pressure control), any other suitable control system or any suitable combinations or super-positions thereof. In some embodiments, shape change elements 610, 620, 630, and 640 may each include only one control lead, although any suitable number of control leads may be used by each shape change element. For example, in some embodiments, shape change element 620 may be a piezoelectric element, and control leads 622 and 624 may include wires and electrodes, which contact element 620. In a further example, in some embodiments, shape change element 630 may be a pneumatic piston-cylinder assembly, control lead 622 may be a gas-filled pressure control tube, and control lead 624 may be a gas vent tube. Any suitable type of control lead may be used to couple one or more shape change elements and one or more control systems.

Control system 650 may be used to form, condition, alter, send and receive control signals, sensory signals, response signals, or any other suitable signals or stimuli, or any combinations thereof, of any suitable type. Control system 650 may be used for actuating, sensing, or otherwise interacting with one or more shape change elements. Control system 650 may include and use control components such as, for example, power supply 654, leads 664, mechanics 666, processing equipment 652 which may include AC source 656, DC source 658, demodulator 660, and signal input 662, and any other suitable component or subsystem, or any suitable combinations of components or subsystems thereof.

Processing equipment 652 may include one or more central processing units, microprocessors, collection of processors (e.g., parallel processors), CPU cache, random access memory (RAM), memory hardware, I/O communications interfaces, multiplexer, de-multiplexer, suitable circuitry, any other hardware components, any suitable software, or suitable combinations thereof. In some embodiments processing equipment 652 may be included in a computer, server, processing facility, personal communications device, personal media device, any other suitable processing device or any suitable combinations thereof. Processing equipment 652 may include hardware and software which may perform logic operations, control other components (e.g., control components 654, 656, 658, 660, 662, 664, 666), execute software commands, coordinate input and output signals (e.g., scanning multiple channels), any other control task or any combinations thereof. Processing equipment 652 may include modules such as AC source 656, DC source 658, demodulator 660, and signal input 662, any other suitable module, or any suitable combinations thereof.

Control system 650 may include power supply 654, which may supply, receive, transmit, limit, or otherwise manage power input and output. Power supply 654 may include one or more energy storage devices (e.g., lithium-ion batteries, nickel-metal hydride batteries, super-capacitors), DC power devices (e.g., solar panels, fuel cells), AC power supplies (e.g., 120 VAC residential power) with or without a DC transformers, any other suitable power source, or any suitable combinations thereof. Power supply 654 may include, for example, components such as rectifiers, inverters, fuses, breakers, contactors, capacitors, any other suitable electronics used to manage power distribution among devices. In some embodiments, power supply 654 may supply power for activating or de-activating shape change elements 610, 620, 630, and 640.

In some embodiments, shape change elements 610, 620, 630, and 640 may supply power, from external stimuli, to power supply 654, via suitable control leads. For example, in some embodiments, shape change element 640 may be a piezoelectric element activated by control system 650, and may receive a stimulus such as, for example, a touch from a user. Shape change element 640 may provide electrical power (e.g., from the piezoelectric effect), converted from mechanical work from the user touch, to power supply 654. Power supply 654 may store, transmit, redirect, or otherwise manage power generated by shape change elements. Any suitable type of "regenerative" haptic control may be used with any suitable type of shape change element.

Although discussed above in terms of electric power, power supply 654 may supply, receive, transmit, limit, or otherwise manage power or energy sources and reservoirs of any type such as, for example, pressurized gas (e.g., gas tank), pressurized liquid (e.g., liquid tank), mechanical loadings (e.g., spring energy), thermal reservoirs, gravitational reservoirs (e.g., elevated fluid tanks), or any other type of power or energy source or combinations thereof.

In some embodiments, processing equipment 652 may include AC source 656 and DC source 658. In some embodiments, AC source 656 and DC source 658 may be used to form suitable electronic signals for controlling one or more shape change elements. In some embodiments, AC source 656 and DC source 658 may be coupled to form a biased AC signal. Any suitable combination of AC signals may be outputted by AC source 656 such as, for example, super-positions of sinusoidal voltages of varying amplitude, frequency and phase. The output signal of AC source 656 may be any suitable waveform such as, for example, sinusoidal, sawtooth, square, rectified AC, or any other suitable waveform or combination of waveforms with alternating or periodic character. The output of DC source 658 may be any type of DC signal such as, for example, a constant voltage, a pulsed voltage of constant amplitude (e.g., PWM signal), stepped voltage, any other suitable DC signal or combinations thereof.

In some embodiments, piezoelectric shape change elements may be controlled using combined AC-DC signals to facilitate both actuation and sensing. For example, control system 650 may use DC source 658 and AC source 656 to output a superposition of a low frequency AC signal, high frequency AC signal, and DC signal, such that a compound signal is produced, to control one or piezoelectric elements. In some embodiments, control system 650 may use AC source 656 to output periodic signals with frequencies having corresponding time scales substantially smaller than time scales of stimuli. For example, in some embodiments, a user may not be able to resolve interactions having time scales less than order 1 millisecond. Control system 650 may use AC source 656 to output AC signal components that have characteristic time scales (e.g., inverse of frequency) shorter than 1 millisecond such that the AC component of the signal is not detected by the user. Control system 650 may use AC source to output one or more signals, or components of signals, with any suitable frequency or characteristic time scale.

In some embodiments, processing equipment 652 may include demodulator 660. Demodulator 660 may be used to detect changes in signal patterns from one or more shape change elements, which may be caused by one or more stimuli. For example, control system 650 may use AC source 656 to provide a control signal to a first shape change element, which may cause vibration of the shape change element. Vibration of the first shape change element may induce a vibration in, and corresponding signal output from, a second shape change element. Control system 650 may monitor both the supplied control signal to the first element and the received signal from the second element. In the event that a tactile stimulus (e.g., user touch) acts upon the second shape change element, demodulator 660 may detect a change in relative properties between the control signal and the received signal, thereby detecting the stimulus. Any suitable interaction among shape change elements may be detected by control system 650, using demodulator 660.

In some embodiments, processing equipment 652 may include signal input 662. Signal input 662 may include signal conditioning hardware, software, or both. Signal input 662 may perform any suitable conditioning process on received signals such as, for example, filtering, amplifying, isolating, combining (e.g., multiplexing and de-multiplexing), extracting, converting (e.g., converting analog to digital, converting frequency to voltage), inverting, counting, any other suitable conditioning process, or any suitable combinations thereof. In some embodiments, processing equipment 652 may couple signal input 662 to power supply 654 (e.g., to store energy from stimuli), demodulator 660 (e.g., to detect stimuli), any other suitable control component, or any suitable combination thereof. In some embodiments, processing equipment 652 may scan across multiple channels of signal input 662 corresponding to multiple shape change elements.

In some embodiments, control system 650 may include control leads 664. Control leads 664 may correspond to leads for any suitable type of control system such as, for example, metal wires and circuitry for electronic systems, conduit or fitting for pneumatic or hydraulic systems, fiber optics for optical systems (e.g., for UV actuated shape memory polymers), any other suitable type of control system, or any suitable combinations thereof. All or some of control leads 664 may be coupled to one or more shape change elements. In some embodiments control leads 664 may be coupled to DC source 658, AC source 656, signal input 664, demodulator 660, power supply 654, any other suitable control component, or any suitable combination thereof. Control leads 664 may be flexible, rigid, or include both flexible and rigid components or sections. For example, in some embodiments, a section of a particular control lead in contact with a shape change element may be substantially rigid, while other sections may be flexible.

In some embodiments, control system 650 may include mechanisms 666. Mechanisms 666 may include any type of linkages, pneumatic devices, hydraulic devices, any other suitable mechanism or hardware, or any suitable combinations thereof, which may be used to control one or more shape change elements. For example, in some embodiments, mechanisms 666 may include valves, pressure regulators, pressure transducers, mass flow controllers, flow switches, any other suitable hardware or combination of hardware, which may be used to control pneumatic (e.g., piston-cylinder type) shape change elements.

Figure 7:
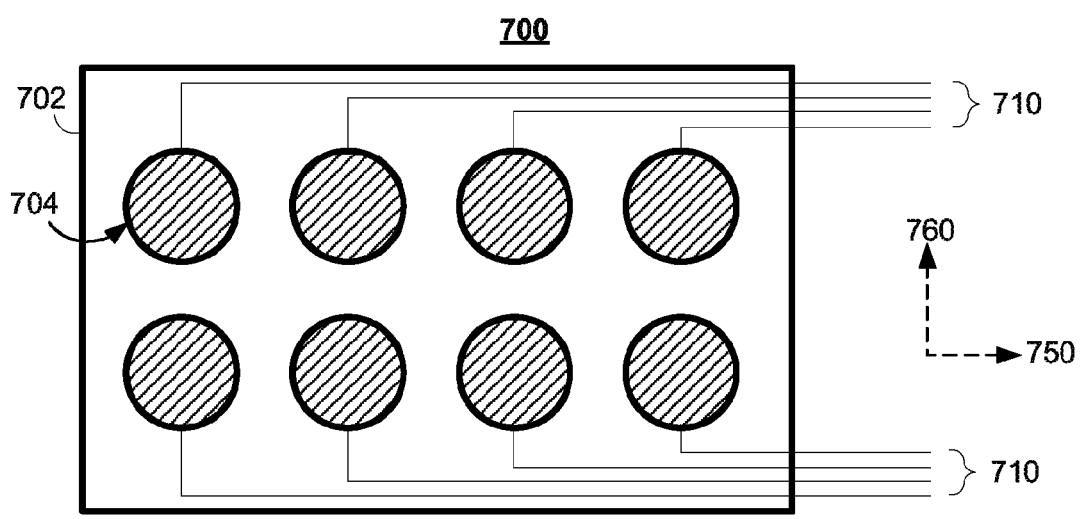
FIG. 7 is a diagram of an illustrative elastic sheet in accordance with some embodiments of the present disclosure.

FIG. 7 is a diagram of illustrative elastic sheet 700 in accordance with some embodiments of the present disclosure. Elastic sheet 700 may include elastic material 702, leads 704, control leads 710, any other suitable materials or components or any suitable combinations thereof. The term "elastic sheet" as used herein shall refer to thin flexible material, which may be positioned adjacent to shape change elements arrays, substrates, or any other components or combination of components.

Elastic sheet 700 may be contiguous or non-contiguous, and may have any suitable shape or size. In some embodiments, elastic sheet 700 may include holes, cutouts, perforations, or other through features. In some embodiments, elastic sheet 700 may include a collection of multiple elastic sheet portions, which may each contact one or more shape change elements. Elastic sheet 700 may include any suitable materials such as, for example, elastomers (e.g., rubber, thermoplastics), polyurethane, polypropylene, polyethylene, polystyrene, polyester, any other suitable elastic material, or any suitable combinations thereof.

In some embodiments, elastic sheet 700 may include one or more layers of elastic material, electronically conductive material, electronically insulating material, any other materials or any suitable combinations of materials and layers thereof. In some arrangements, electronically conductive material may form one or more conductive paths on one or more surfaces of elastic sheet 700. In some embodiments, the conductive paths may correspond to leads 704, control leads 710, or both. Leads 704 may be coupled to one or more shape change elements, and control leads 710 may be coupled to a control system (e.g., control system 650). For example, in some embodiments, control leads 704 may be electrodes which may be in contact with one or more piezoelectric elements. Control leads 704 may be coupled to leads 710 to transmit control signals to and from a control system (e.g., control system 650).

In some embodiments, each shape change element in contact with elastic sheet 700, may be coupled to one or more of control leads 704, leads 710, or both, and which may not contact (e.g., be electrically insulated from) or mixed with (e.g., non-connected pressure lines) other control leads or leads. Any suitable number of leads may be used to control one or more shape change elements, and may arranged in any suitable pattern on a particular elastic sheet. In some embodiments leads 704 and control leads 710 may be rigidly affixed to elastic material 702 by techniques such as, for example, gluing, bonding, clamping, or other affixing technique or combinations of techniques. In some embodiments, a "common" control lead may be used which may be coupled to some or all shape change elements in one or more arrays. Each shape change element may be coupled to a second control lead which may apply a control signal relative to the common control lead.

Vectors 750 and 760 shown in FIG. 7 are directed normal to each other, in the plane of illustrative elastic sheet 700. Direction "C" (not shown) will be defined as the cross product of vectors 750 and 760 (i.e., vector 750×vector 760), and is directed normal to both vectors 750 and 760. In some embodiments, elastic sheet 700 may have spatial dimensions substantially thinner along direction "C" than along either of the directions of vectors 750, 760, or both (e.g., a thin square sheet). In some embodiments, elastic sheet 700 may be suitably stacked in direction "C", with one or more arrays of shape change elements, to form a tiered haptic system.

In some embodiments, portions of elastic sheet 700 may be rigid, or may include rigid components such that portions are rigid. For example, in some embodiments, leads 704 may be substantially rigid, and may impart rigidity to portions of elastic sheet 700 affixed to leads 704. In some embodiments, components other than leads may impart rigidity to some or all of elastic sheet 700.

Figure 8:
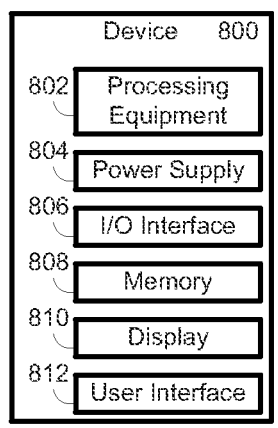
FIG. 8 is a schematic diagram of an illustrative user device in accordance with some embodiments of the present disclosure.

FIG. 8 is a schematic diagram of illustrative user device 800 in accordance with some embodiments of the present disclosure. In some embodiments user device 800 may be a computer (e.g., laptop, tablet, desktop), server, processing facility, personal communications device (e.g., smart phone), personal media device (e.g., MP3 player), personal digital assistant, any other suitable user device or any suitable combinations thereof. User device 800 may include processing equipment 802, power supply 804, I/O interface 806, memory 808, display 810, user interface 812, any other suitable components, or any suitable combinations thereof. In some embodiments, processing equipment 802 of user device 800 may include some or all of the control components of control system 600. Processing equipment 802 may include one or more central processing units, microprocessors, collection of processors (e.g., parallel processors), CPU cache, random access memory (RAM), memory hardware, I/O communications interfaces, suitable circuitry, any other hardware components, any suitable software, or suitable combinations thereof.

Power supply 804 may supply, receive, transmit, or otherwise achieve power input and output. Power supply 804 may communicate with, and be controlled by, processing equipment 802. Power supply 804 may include one or more energy storage devices (e.g., one or more batteries of any suitable type), DC power supplies (e.g., solar panels, fuel cells, supercapacitors), AC power supplies (e.g., 120 VAC residential power) with or without a DC transformer, any other suitable power source, or any suitable combinations thereof. In some embodiments, power supply 804 may supply power user device 800. In some embodiments, power supply 804 may store, transmit, redirect, or otherwise manage power generated by user device 800. Regenerative haptic control may be used with any suitable type of shape change element.

Input-output (I/O) interface 806 may include any suitable communications interfaces for wired (e.g., local area networks) or wireless (e.g., WiFi, GSM, PCS) communication with networks (e.g., internet, mobile internet, media servers), other user devices (e.g., remote smart phone), remote facilities, any other facility or device, or any suitable combination thereof, which may communicate with user device 800.

Memory 808 may be used for storing or recalling data, applications, or both, and may be coupled to user device 800. Memory 800 may be a portable hard drive, flash memory drive, MultiMediaCard (MMC), SecureDigital (SD) card, SIM card, compact disk reading and writing device, zip drive, disk drive, any other suitable memory device, or combination thereof. Memory 808 may communicate with processing equipment 802 via a universal serial bus (USB) coupling, MMC coupling, SD coupling, any other suitable communications path or any combination thereof.

Display 810 provides a display output, and may be coupled to user device 800. Display 800 may be a computer monitor, television, video projector, light emitting diode screen (e.g., LED, organic LED), liquid crystal display (LCD) screen, plasma screen, CRT screen, head-mounted display (e.g., video glasses), any other suitable display device or any combination thereof. Display 810 may be, in some embodiments, integral to user device 800 such as, for example, a screen associated with a laptop computer, mobile phone, tablet device, personal media device, or other user device the provides a display.

User interface 812 may also allow user inputs, responses, selections, any other user initiated stimuli or combinations thereof to be received by user device 800. User interface 812 may include haptic systems (e.g., a touchscreen), selectable hard buttons, speakers, a microphone (e.g., for voice commands), mouse, keyboard, any other system used for user interaction, or any combinations thereof. In some embodiments, a portion or all of user interface 866 may integrated with display 810 (e.g., interactive touchscreen).

Figure 9:
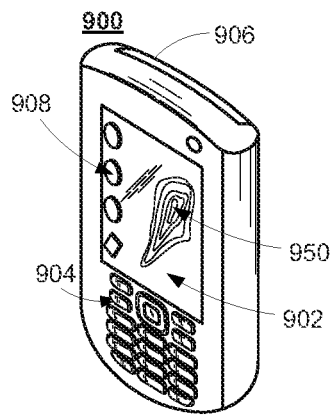
FIG. 9 is a diagram of an illustrative portable user device in accordance with some embodiments of the present disclosure.

FIG. 9 is a diagram of illustrative portable user device 900 in accordance with some embodiments of the present disclosure. In some embodiments, user device may correspond substantially to illustrative user device 800, and may include any hardware, software or components of illustrative user device 800. In some embodiments, user device 900 may be a personal communications device or personal media device. User device 900 may include display 902, hard commands 904, soft commands 908, contoured screen feature 950, power supply 906 (e.g., power supply 804), any other suitable components or any suitable combinations thereof. In some embodiments, display 902 may include haptic systems, a visual display, a cover, any other suitable component or any suitable combinations thereof.

In some embodiments, for example, user device 900 may be a smart phone with touchscreen display 902. Touchscreen display 902 may include one or more soft commands 908 (e.g., touch button commands), which may correspond to particular regions of display 902. In some embodiments, display 902 displays graphical information conveying that a soft command 908 is available to a user (e.g., an image of a button). In the event that a user provides tactile stimulus to the region of display 902 corresponding to the image of the button, user device 900 may perform one or more functions. For example, user device 900 may provide a soft command that corresponds to a particular media selection (e.g., a podcast in an iTunes® library). User device 900 may play the particular media selection in response to user selection of the soft command button. In some embodiments, soft commands 908 may correspond to contoured features on display 902, which may arise from activation of one or more shape change elements. For example, one or more piezoelectric elements may be used to form a raised button on display 902. In the event that a user provides tactile stimulus to the raised button, user device 900 may perform one or more functions.

In some embodiments, contoured surfaces may be formed on display 902 using one or more shape change elements. For example, contoured screen feature 950 may be a geographical contour map, in which portions of the display are raised in accordance with corresponding elevation data. In some embodiments, any suitable contour, deformation, topology, or other suitable surface feature, or combination of features, may be formed on display 902 such as, for example, raised buttons, raised arrows, depressions, patterns, or moving features (e.g., cursors). In some embodiments, tactile stimuli to display 902 may be detected by user device 900. For example, user device 900 may detect that a user has touched a particular surface feature on display 902, and may execute a particular task associated with the surface feature.

In some embodiments, display 902 of illustrative user device 900 or display 810 of illustrative user device 800 may be partitioned in any suitable manner. For example, in some embodiments, display 902 may include one or more dedicated haptic response display regions. The dedicated haptic response display regions may include stacked arrays of shape change elements, elastic sheets, rigid substrate, any other suitable components, or any suitable combinations thereof. For example, in some embodiments, half of the display may include haptic controls while half of the display does not. In some arrangements, user device 900 or user device 800 may include more than one display, which may or may not be adjacent. For example, in some embodiments, user device may include a first display which may include haptic response, and a second display which may not include haptic response. In some arrangements, a screen may be provided on user device 900 or user device 800 which may include haptic response, but may not include a display screen. Any suitable combination of fixed displays and haptic displays may be included in illustrative user device 900 or illustrative user device 800.

Illustrative embodiments of haptic systems in accordance with the present disclosure will be discussed further in the context of illustrative FIGS. 10-21. FIGS. 10-21 show exemplary embodiments of haptic systems. In some embodiments, all functions and options related to haptic controls and systems known in the art may be available to haptic systems. It will also be understood that any suitable components, arrangements, assemblies, positions, or other features illustratively discussed in the context of FIGS. 10-21 may be combined, omitted, altered, or otherwise rearranged without departing from the scope of the present disclosure. Although not shown, the illustrative haptic systems shown in FIGS. 10-21 may include any suitable control system.

Illustrative embodiments of tiered haptic systems in accordance with the present disclosure will be discussed further in the context of illustrative FIGS. 10-17. FIGS. 10-17 show exemplary tiered haptic systems. In some embodiments, all functions and options related to haptic controls and systems known in the art may be available to tiered haptic systems. Although illustrative FIGS. 10-17 show isolated tiered haptic systems, it will be understood that the tiered haptic systems may be included in any suitable user device (e.g., user device 900 of FIG. 9) or haptic control system.

Figure 10:
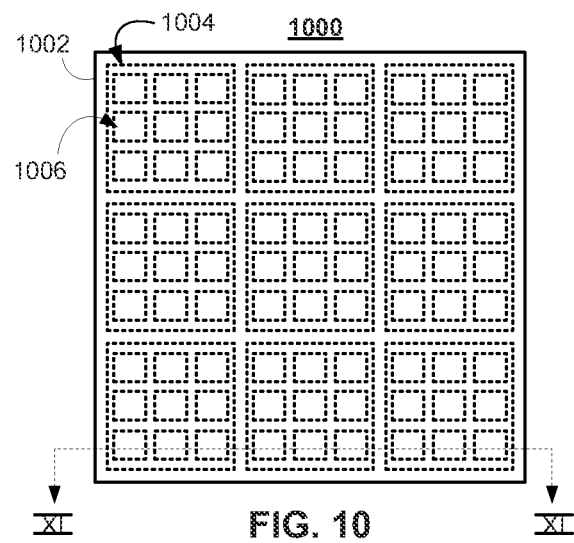
FIG. 10 shows an illustrative top plan view of a tiered haptic system in accordance with some embodiments of the present disclosure.
Figure 11:
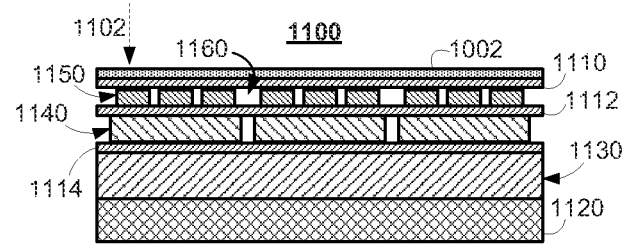
FIG. 11 shows an illustrative cross-sectional view of the elements of FIG. 10, taken from line XI-XI, in accordance with some embodiments of the present disclosure.

FIG. 10 shows an illustrative top plan view of tiered haptic system 1000 in accordance with some embodiments of the present disclosure. Shown in FIG. 11 is illustrative cross-sectional view 1100 of the elements of FIG. 10, taken from line XI-XI of FIG. 10, in accordance with some embodiments of the present disclosure. In some embodiments, for example, tiered haptic system 1000 may be included as a component or portion of display 902 of FIG. 9, or display 810 of FIG. 8. Tiered haptic system 1000 may include display screen 1002, elastic sheets 1110, 1112 and 1114, substrate 1120, shape change element arrays 1130, 1140 and 1150, any other suitable components or any suitable combinations thereof. Any suitable number of "tiers", or stacked arrays of shape change elements, may be used in accordance with the present disclosure. In some embodiments, for example, display screen 1002 may be viewed by a user substantially in direction 1102.

In some embodiments, display screen 1002 and adjacent elastic sheet 1110 may form an "elastic screen sheet". The elastic screen sheet may provide a visual, tactile, or both, interface with which a user may interact. In some embodiments, an elastic screen sheet may include only display screen 1002. In some embodiments, an elastic screen sheet may include only elastic sheet 1110. Tiered haptic systems may include any suitable number of elastic screen sheets, in any suitable arrangement, in accordance with the present disclosure.

Display screen 1002 may be any suitable type of display screen which may allow haptic interaction. For example, in some embodiments, display screen 1002 may be a flexible organic light emitting diode screen (OLED), a graphene sheet, or any other suitable flexible display screen or any suitable combinations thereof. In some embodiments, display screen 1002 may be substantially inflexible, and may not form contoured screen surfaces. In some embodiments, display screen 1002 may include a protective cover such as, for example, clear plastic (e.g., Lexan®) or any other suitable substantially transparent material. Display screen 1002 may display any combination of graphics, images, video, tables (e.g., iTunes listings), text, contacts (e.g., phone list), any other type of visual information or graphics, or any suitable combination thereof. The display of display screen 1002 may be monochrome (e.g., black and white), color, grayscale, any other suitable color scale or any suitable combination thereof. In some embodiments, display screen 1002 may be segmented or partitioned such that display screen 1002 includes one or more smaller screens, which may allow for further screen contouring.

Elements of arrays 1006 and 1004 are shown in FIG. 10 as dotted outlines. In some embodiments, arrays may be arranged in any suitable pattern. The elements of arrays 1004 and 1006 need not be of substantially similar size or shape. In some embodiments, arrays 1004 and 1006 of FIG. 10 may correspond to arrays 1140 and 1150 of FIG. 11, respectively.

In some embodiments, substrate 1120 may provide a substantially rigid base for haptic system 1000. Substrate 1120 may include any suitable material such as, for example, metal (e.g., steel, magnesium, aluminum), hard plastic, composite materials, any other suitable substantially rigid materials or any combinations thereof. In some embodiments, one or more arrays of shape change elements (e.g., array 1130 of FIG. 11) may be rigidly affixed to substrate 1120. In some arrangements, substrate 1120 may correspond to a portion of a frame or chassis (e.g., a midplate) of a suitable user device. Substrate 1120 may correspond to any suitable rigid mechanical datum.

Illustrative elastic sheets 1110, 1112, and 1114 may be included in tiered haptic system 1000. Elastic sheets may be used for any suitable purpose including, for example, mounting, affixing, stabilizing, cushioning, deforming (e.g., haptic contouring), providing tension, providing compression, providing surfaces for leads, any other suitable function or any suitable combinations thereof. Tiered haptic system 1000 may include any suitable number of elastic sheets and, in some embodiments, may not include elastic sheets. Elastic sheets 1110, 1112, and 1114 may deform or contour to follow the surfaces or positions of shape change elements in one or more arrays. In some arrangements, only elastic sheet 1110 may be affixed to a shape change element array (e.g., array 1150), which may allow elastic sheet 1110 to more closely follow contours of the array. In some embodiments, elastic sheets may be rigidly affixed to shape change elements using, for example, an adhesive or any other bonding material. Elastic sheets 1110, 1112, and 1114 may include thin sheets of any suitable materials such as, for example, elastomers (e.g., rubber, thermoplastics), polyurethane, polypropylene, polyethylene, polystyrene, polyester, any other suitable elastic material, or any suitable combinations thereof.

In some embodiments, elastic sheets 1110, 1112, and 1114 may include one or more layers of elastic material, electronically conductive material (e.g., foams, adhesives, metal, graphite), electronically insulating material, any other materials or any suitable combinations of materials and layers thereof. In some arrangements, electronically conductive material may form one or more conductive paths on one or more surfaces of elastic sheets 1110, 1112, and 1114. In some embodiments, the conductive paths may correspond to control leads.

In some arrangements, one or more of elastic sheets 1110, 1112, and 1114 may be contiguous or non-contiguous (e.g., segmented, partitioned). For example, in some embodiments, each shape change element of a particular array may contact an elastic sheet of substantially the same dimensions as the shape change element. In such an arrangement, the segments (e.g., sheets contacting each shape change element) of a particular sheet may or may not contact each other. Non-contiguous elastic sheets may, in some embodiments, allow for increased deformation or contouring of an adjacent array of shape change elements. In some arrangements, one or more of elastic sheets 1110, 1112, and 1114 may include holes, cutouts, perforations, or other through features which may increase flexibility for deformation, provide one or more surfaces for attaching leads, reduce weight, any other suitable purpose or combination thereof.

Illustrative shape change element arrays 1130, 1140, and 1150 may be included in tiered haptic system 1000 to provide actuation, sensing, or both. Each of arrays 1130, 1140, and 1150 may include any suitable number of shape change elements. Tiered haptic system 1000 may use any suitable number of "tiers", or stacked arrays of shape change elements. In some embodiments, arrays may contact one another directly. For example, in some embodiments, the shape change elements of array 1140 may contact the shape change elements of array 1150, and elastic sheet 1112 may not be included. The shape change elements of a particular array may or may not contact one another in the un-activated or activated state. For example, in some embodiments, there may be a gap or space between adjacent shape change elements in a particular array to allow for displacement in the plane of the array. In some embodiments, space 1160 may exist between one or more shape change elements of an array. Space 1160 may allow for lateral expansion and contraction in the plane of array 1150. In some embodiments, space 1160 may be substantially vented to the atmosphere, which may maintain atmospheric pressure. In some embodiments, space 1160 may be sealed from the atmosphere.

Although shown as being substantially parallel, shape change element arrays 1130, 1140, and 1150 may have any suitable orientation or relative orientation. For example, in some embodiments, a first array may be positioned substantially parallel to a substrate. The elements of a second array may be positioned at a suitable angle relative to the first array. In some embodiments, shape change elements of a particular array may be affixed in an off-centered manner to an elastic sheet or other shape change elements of an adjacent array. Off-centered mounting (e.g., adhering an edge of an element rather than the center) may allow shape change elements to provide lateral displacement (e.g., lateral displacement), motion (e.g., lateral vibration), force (e.g., shear force), or other suitable physical response or any combination thereof, substantially in the plane of the array.

Each shape change element of arrays 1130, 1140, and 1150 may be coupled to control leads, which may be coupled to a suitable control system (e.g., control system 650 of FIG. 6, processing equipment 802 of FIG. 8). In some embodiments, a suitable control system may be used to actuate one or more shape change elements of one or more arrays. In some embodiments, one or more shape change elements of one or more arrays may be in the activated state at a given time.

Shape change elements may activated in any suitable manner including, for example, vibration, net displacement, any other suitable activation mode or any combinations thereof. For example, in some embodiments, one or more shape change elements in or more arrays may be actuated with a vibratory control signal (e.g., AC, biased AC, pulsed DC) at a particular frequency and amplitude. This type of vibratory actuation may, in some embodiments, provide a tactile rumbling or oscillation that may be substantially detected by a user. In a further example, a high frequency vibratory control signal may be supplied to one or more shape change elements of one or more arrays. The high frequency signal may have a characteristic time scale that may not be detectable by a user. High frequency vibratory actuation may not, in some embodiments, provide a tactile rumbling or oscillation that may be substantially detected by a user. In some embodiments, vibrations may be used which may have corresponding frequencies several orders of magnitude higher than frequencies that may be detectable by a user.

The shape change elements of arrays 1130, 1140 and 1150 may be of the same size or different size. For example, in some embodiments, the shape change elements of array 1130 may be 0.3 mm tall, the shape change elements of array 1140 may be 0.2 mm tall, and the shape change elements of array 1150 may be 0.1 mm tall, as measured in direction 1102. In some embodiments, all shape change elements may have a particular height such as, for example, 0.1 mm. Any suitable combination of shape change element sizes in each array, or within a particular array, may be used in accordance with the present disclosure.

Although not shown in illustrative FIGS. 10-11, any suitable additional layers may be included in the disclosed haptic system. For example, in some embodiments, haptic systems may include spacing layers, insulating layers, electronically conducting layers, composite layers, protective layers, shock-absorbing layers, any other suitable layers, or any suitable combinations thereof. The disclosed haptic systems may include any suitable touchscreen technology such as, for example, resistive touchscreen layers, capacitive touchscreen layers (e.g., surface capacitance, mutual capacitance, self capacitance, projected capacitance), infrared touchscreen layers (e.g., with infrared sources and photodetectors), acoustic touchscreen layers, mechanical touchscreen technology, any other suitable touchscreen technology, or any suitable combinations thereof. For example, in some embodiments, a mutual capacitance touchscreen layer may be positioned between, and substantially parallel to, illustrative display screen 1002 and elastic sheet 1110. Any suitable arrangement may be used in accordance with the disclosed haptic systems.

Shown in FIGS. 12-21 are illustrative partial cross sections of haptic systems. The corresponding top plan views of the partial cross sections of illustrative embodiments shown in FIGS. 12-21 may be substantially similar to the top view shown in FIG. 1000. In some embodiments, a frame may be included, which may partially outline, block, cover or otherwise follow some edges of the display.

Figure 12:
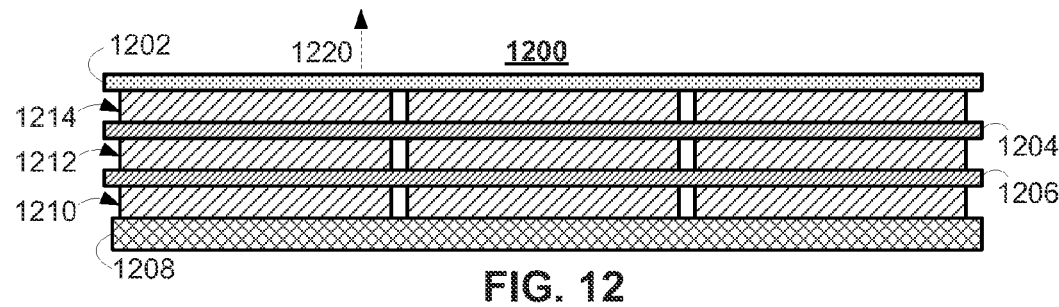
FIG. 12 shows an illustrative cross-sectional view of a tiered haptic system with similar arrays in accordance with some embodiments of the present disclosure.

FIG. 12 shows an illustrative partial cross-sectional view of tiered haptic system 1200 in accordance with some embodiments of the present disclosure. Tiered haptic system 1200 may include screen 1202, elastic sheets 1204 and 1206, arrays 1210, 1212 and 1214, any other suitable components or any suitable combinations thereof. In some embodiments, tiered haptic system 1200 may include illustrative arrays 1210, 1212, and 1214 of shape change elements that are substantially of the same size in all arrays. In some arrangements, stacked arrays of shape change elements of substantially the same size may provide increased haptic resolution in actuation, sensing or both. Any suitable combination of shape change elements may be used by tiered haptic system 1200, including, for example, arrays which all include shape change elements of a particular size or shape, arrays which each include shape change elements of a particular size or shape, arrays which include shape change elements of various sizes or shapes, any other suitable arrangement, or any suitable combination thereof. In some embodiments, stacked arrays of similarly sized elements may provide greater resolution in displacement, force, sensing, any other physical response or combinations thereof, relative to a non-tiered arrangement.

Figure 13:
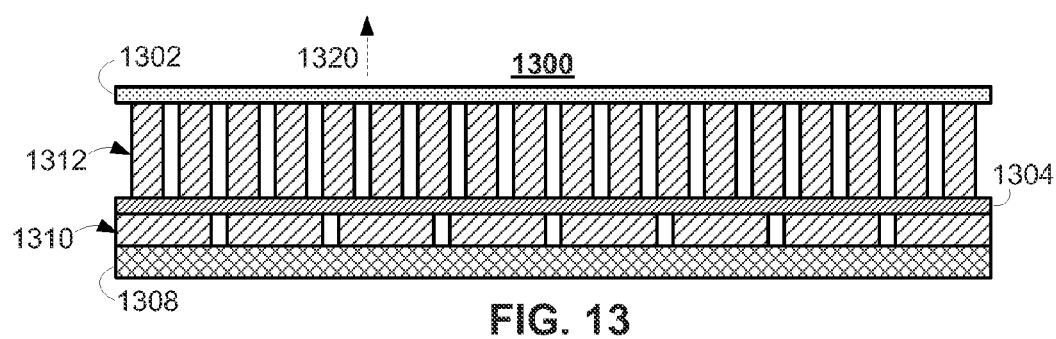
FIG. 13 shows an illustrative cross-sectional view of a tiered haptic system with varied haptic element orientation in accordance with some embodiments of the present disclosure.

FIG. 13 shows an illustrative partial cross-sectional view of tiered haptic system 1300 in accordance with some embodiments of the present disclosure. Tiered haptic system 1200 may include screen 1202, elastic sheets 1204 and 1206, arrays 1210, 1212 and 1214, any other suitable components or any suitable combinations thereof. In some embodiments, tiered haptic system 1300 may include illustrative arrays 1310 and 1312 of shape change elements that are substantially of the same size, but may be mounted in different orientations. Any suitable combination of shape change elements, arrays of shape change elements may be included in tiered haptic system 1300. For example, in some embodiments, array 1310 and 1312 may be switched relative to FIG. 13 such that array 1312 may be positioned closer to substrate 1308, and array 1310 may be positioned closer to screen 1302.

Tiered haptic systems (e.g., system 1200 of FIG. 12, system 1300 of FIG. 1300) may include shape change elements which may have any suitable preferred direction (e.g., polarization direction for piezoelectric elements). For example, in some embodiments, one or more shape change elements may have a preferred direction substantially along direction 1220 or 1320. In some embodiments, one or more shape change elements may have a preferred direction other than (e.g., normal to, 45 degrees from) direction 1220 or 1320. Any suitable preferred direction may be associated with any shape change element or combination of elements.

Figure 14:
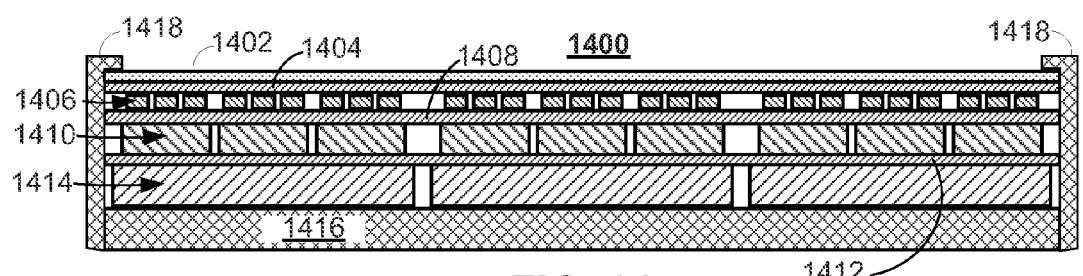
FIG. 14 shows an illustrative cross-sectional view of a tiered haptic system with multiple arrays in accordance with some embodiments of the present disclosure.
Figure 15:
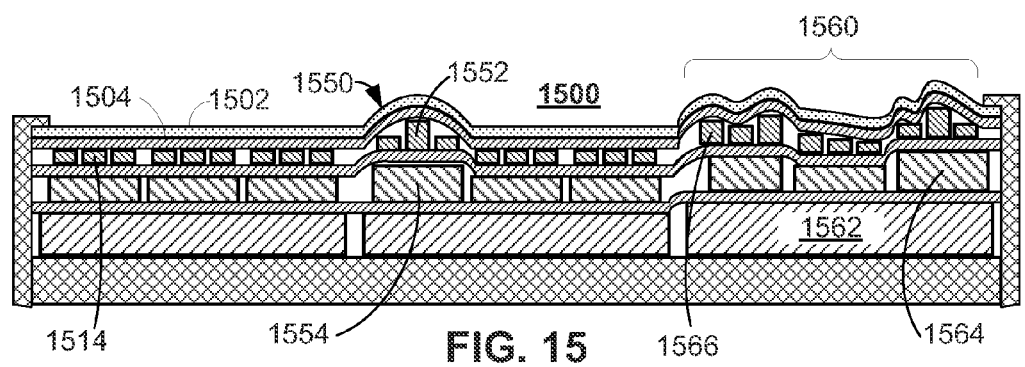
FIG. 15 shows an illustrative cross-sectional view of a tiered haptic system with a contoured display in accordance with some embodiments of the present disclosure.

FIG. 14 shows an illustrative partial cross-sectional view of substantially un-activated tiered haptic system 1400 in accordance with some embodiments of the present disclosure. FIG. 15 shows an illustrative partial cross-sectional view of activated tiered haptic system 1500 in accordance with some embodiments of the present disclosure. In some embodiments, activated tiered haptic system 1500 may correspond to a particular activated state of substantially un-activated tiered haptic system 1400. Tiered haptic system 1400 may include display screen 1402, elastic sheets 1404, 1408 and 1412, shape change element arrays 1406, 1410 and 1414, substrate 1416, frame 1418, any other suitable component, or any suitable combinations thereof. In some embodiments, display screen 1402, elastic sheets 1404, 1408 and 1412, shape change element arrays 1406, 1410 and 1414, and substrate 1416 may be positioned substantially parallel to each other as shown in FIG. 14. Display screen 1402 may be a flexible OLED, a graphene sheet, or any other suitable flexible display screen or any suitable combinations thereof. In some embodiments, display screen 1402 may include a protective cover of any suitable substantially transparent material. Display screen 1402 may display any combination of graphics, images, video, tables, text, contacts, any other type of visual information or graphics, or any suitable combination thereof. The display of display screen 1402 may be monochrome, color, grayscale, any other suitable color scale or any suitable combination thereof. In some embodiments, display screen 1402 may be segmented or partitioned such that display screen 1402 includes one or more smaller screens.

In some embodiments, elastic sheet 1404 may be positioned substantially parallel to, and in contact with, display screen 1402. Elastic sheet 1404 may be adhered to display screen 1402 in some embodiments. In some embodiments, tiered haptic system 1400 may not include elastic sheet 1404, and display screen 1402 may substantially contact one or more elements of array 1406. Elastic sheet 1404 may cushion (e.g., reduce impact to) display 1402 from actuation of one or more elements in arrays 1406, 1410, or 1414, or any combination thereof. Arrays 1406, 1410, and 1414 may each include any combination of suitable shape change elements such as, for example, piezoelectric elements, electroactive polymer elements, any other suitable shape change elements or any suitable combination thereof. As shown in illustrative FIG. 14, each array includes a horizontal row of shape change elements. The arrangement of FIG. 14 is illustrative, and any suitable collection of shape change elements may be included in an array.

In some embodiments, the elements of array 1406 may be rigidly affixed (e.g., bonded, glued), or otherwise positioned adjacent to, to elastic sheet 1404. In some embodiments, the elements of array 1406 may be in contact with, affixed to (e.g., bonded, glued), or otherwise positioned adjacent to, elastic sheet 1408. The elements of array 1410 may, for example, be in contact with, affixed to (e.g., bonded, glued), or otherwise positioned adjacent to, the side of elastic sheet 1408 opposite of array 1406. In some embodiments, elastic sheet 1412 may be positioned adjacent to, and in contact with, array 1410. The elements of array 1414 may, for example, be in contact with, affixed to (e.g., bonded, glued), or otherwise positioned adjacent to, the side of elastic sheet 1412 opposite of array 1410. The stack of elastic sheets 1404, 1408 and 1412, and arrays 1406, 1410 and 1414 may, in some embodiments, include fewer or more elastic sheets and arrays. For example, in some embodiments, a stack of three arrays may be used. In a further example, in some embodiments, a stack of two arrays and one elastic sheet may be used. Any suitable combination of components may be included in tiered haptic system 1400.

Rigid substrate 1416 may be coupled to one or more elastic sheets, or one or more elements included in one more arrays. In some embodiments, an elastic sheet may be positioned between array 1414 and substrate 1416. In some embodiments, a non-elastic sheet may be positioned between array 1414 and substrate 1416. Frame 1418 may be included in tiered haptic system 1400, in some embodiments. Frame 1418 may impart rigidity, maintain component positions (e.g., prevent disassembly), serve as a mount for control couplings, any other suitable structural function or any suitable combinations thereof. In some embodiments, frame 1418 and substrate 1416 may be portions of chassis or other structural component. In some embodiments, frame 1418 and substrate 1416 may be a single component of suitable shape and size.

In some arrangements, electronically conductive material may form one or more conductive paths on one or more surfaces of elastic sheets 1404, 1408 and 1412. In some embodiments, conductive paths may correspond to control leads. Each shape change element of each array may be controlled by a suitable control system (e.g., control system 650 of FIG. 6, processing equipment 802 of FIG. 8). In some embodiments, actuation of one or more shape change elements may impart motion, displacement, force, any other suitable physical response or any combination thereof, to another shape change element in the same array or a different array. The control system may monitor sent and received control signals for both the actuated elements and responding elements. The control system may control each shape change element separately, in groups (e.g., arrays), or as a whole (e.g., all elements controlled with a particular signal).

Tiered haptic system 1500 may correspond to a particular activated state of tiered haptic system 1400. Display screen 1502 may correspond substantially to a contoured state of display screen 1402 of FIG. 14. Elastic sheet 1504 may correspond substantially to a contoured state of elastic sheet 1404 of FIG. 14. In some embodiments, topological features such as, for example, raised button 1550 may be formed on display screen 1402. Topological features such as raised button 1550 may be formed by activation of one or more shape change elements such as, for example, elements 1552 and 1554. Element 1552 may correspond to an element in array 1406 of FIG. 14, and element 1554 may correspond to an element in array 1410 of FIG. 14. In some embodiments, one or more elements of the same array (e.g., array 1406) as a particular activated element (e.g., element 1552) may not be substantially activated at a concurrent time (e.g., element 1508). Illustrative topological feature 1560 may contain multiple raised features, which may be formed by activation of one or more shape change elements such as, for example, elements 1562, 1564, 1566, and other elements. In some embodiments, display screen 1502 may be rigidly affixed to an elastic sheet, which may be rigidly affixed to an array of shape change elements. Rigid mounting of display screen 1502 may allow for concave or convex contours to be formed by suitable actuation of shape change elements. In some embodiments, shape change elements may be in a suitable vibratory active state such that display screen 1502 and adjacent elastic sheet 1504 may substantially undergo a constant deformation. For example, in some embodiments, shape change element 1552, for example, may vibrate at a frequency with a characteristic time scale smaller than the relaxation time of display screen 1502 or elastic sheet 1504. In some embodiments, elastic sheet 1504 may not be rigidly affixed to one or more elements in the adjacent array. For example, feature 1550 may be formed by vibration of element 1552 at a suitable frequency such that elastic sheet 1504 and display 1502 remain under substantially constant deformation. In a further example, a particular elastic sheet and display screen may have a relaxation time scale corresponding to 1000 Hertz. An element may be driven at a frequency of 50,000 Hertz to form a substantially constant topography of the elastic sheet and display. In some embodiments, an elastic sheet may vibrate substantially with an adjacent shape change element, while a display screen adjacent to the elastic sheet may maintain substantially constant deformation. Any type of suitable control signal may be used to form any type of suitable topography on display screen 1502.

Figure 16:
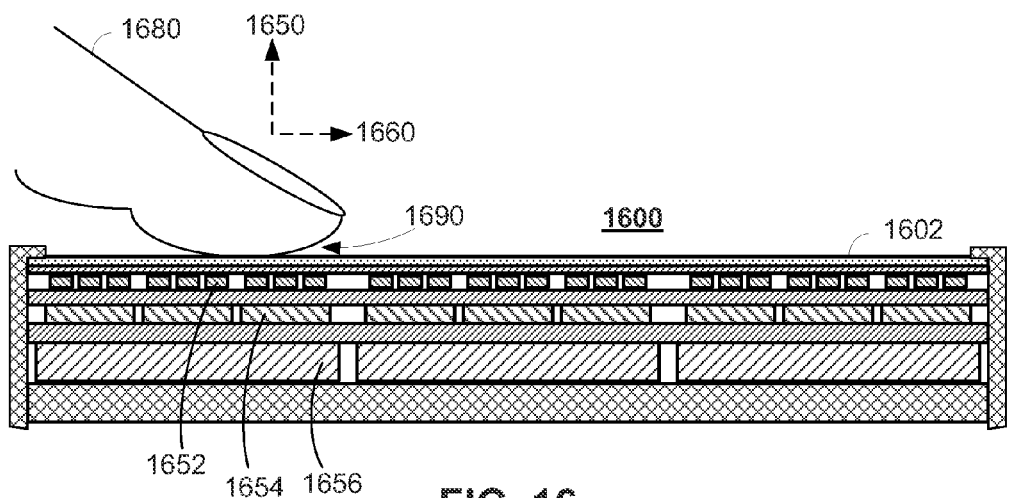
FIG. 16 shows an illustrative cross-sectional view of a tiered haptic system with a flat display receiving tactile stimuli in accordance with some embodiments of the present disclosure.

FIG. 16 shows an illustrative partial cross-sectional view of tiered haptic system 1600 receiving stimulus in accordance with some embodiments of the present disclosure. In some embodiments, tiered haptic system 1600 may correspond to a particular activated state of tiered haptic system 1400. Tiered haptic system 1600 may include display screen 1602, elastic sheets, arrays of shape change elements, a substrate, a frame, any other suitable components, or any suitable combinations thereof. In some embodiments, one or more shape change elements of one or more arrays may be in an activated state at a given time. For example, in some embodiments, elements 1652, 1654 and 1656 may, for example, be in a high frequency (e.g., substantially undetectable to a user) vibratory active state. Elements other than elements 1652, 1654 and 1656 may each be un-activated or in any suitable activated state.

In some embodiments, tiered haptic system 1600 may receive tactile stimuli on display screen 1602 such as, for example, contact on region 1690 from user motion. For example, in some embodiments, display 1602 may receive tactile stimulus at region 1690 from user finger 1680 moving in axis 1650, 1660, an axis normal to both directions 1650 and 1660, or any combination of directions. Any suitable user motion may provide tactile stimulus such as, for example, tapping, multiple tapping, pressing, swiping, any other screen contact mode or any suitable combinations thereof. In some embodiments, tiered haptic system 1600 may receive tactile stimuli on multiple regions concurrently (e.g., contact in more than one region). In some embodiments, tactile stimuli received on region 1690 of display screen 1602 may provide physical stimuli to one or more of elements 1652, 1654, 1656, any other suitable elements or any suitable combinations thereof. For example, tactile stimuli by user 1680 on region 1690 of display 1602 may provide physical stimuli to one or more of elements 1652, 1654 and 1656, which may be in a high frequency vibratory activated state. A control system coupled to elements 1652, 1654 and 1656 may detect the physical stimuli using any suitable processing equipment or combination of processing equipment (e.g., signal input 662 and demodulator 660 of FIG. 6). In some embodiments, one or more elements of one or more arrays may each be in particular activated states, which may or may not cause substantial deformation or contouring of display 1602. For example, in some embodiments, one or more elements of one or more arrays may each be in particular activated states (e.g., high frequency vibration) and display 1602 may be substantially flat.

Figure 17:
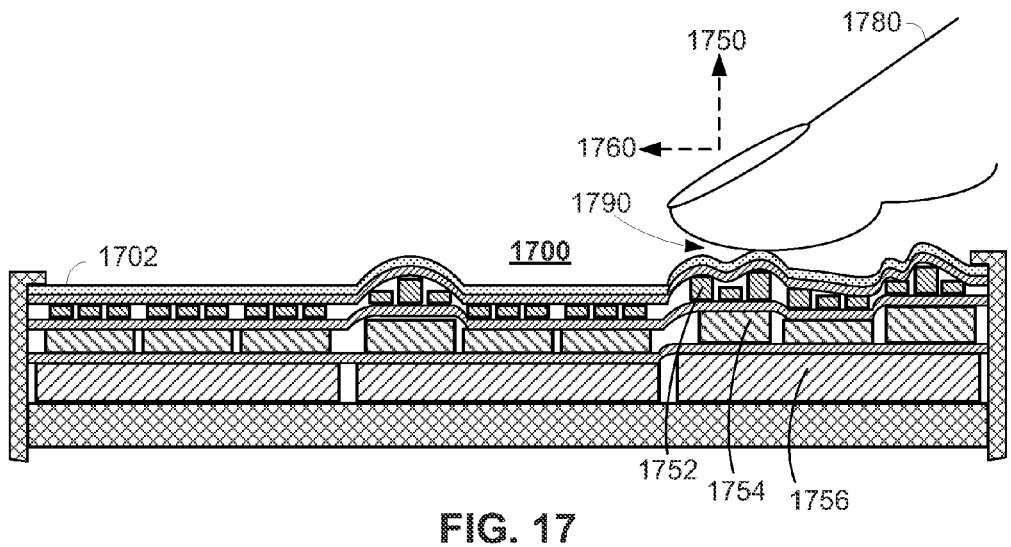
FIG. 17 shows an illustrative cross-sectional view of a tiered haptic system with contoured display receiving tactile stimuli in accordance with some embodiments of the present disclosure.

FIG. 17 shows an illustrative partial cross-sectional view of tiered haptic system 1700 receiving stimulus in accordance with some embodiments of the present disclosure. In some embodiments, activated tiered haptic system 1700 may correspond to a particular activated state of tiered haptic system 1600, which may include one or more topological features (e.g., raised buttons, depressions). Tiered haptic system 1700 may include contoured display screen 1702, elastic sheets, arrays of shape change elements, a substrate, a frame, any other suitable components, or any suitable combinations thereof. In some embodiments, one or more shape change elements of one or more arrays may be in an activated state at a given time. For example, in some embodiments, elements 1752, 1754 and 1756 may each be in active states including combinations of net displacement (as shown illustratively in FIG. 17) and high frequency vibration. Elements other than elements 1752, 1754 and 1756 may each be in un-activated states or in any suitable activated states.

In some embodiments, tiered haptic system 1700 may receive tactile stimuli on display screen 1702 such as, for example, contact on region 1790 from user motion. For example, in some embodiments, display 1702 may receive tactile stimulus at region 1790 from user finger 1780 moving in axis 1750, 1760, an axis normal to both directions 1750 and 1760, or any combination of directions. Any suitable user motion may provide tactile stimulus such as, for example, tapping, multiple tapping, pressing, swiping, any other screen contact mode or any suitable combinations thereof. In some embodiments, tiered haptic system 1700 may receive tactile stimuli on multiple regions concurrently (e.g., contact in more than one region). In some embodiments, tactile stimuli received on region 1790 of display screen 1702 may provide physical stimuli to one or more of elements 1752, 1754, 1756, any other suitable elements or any suitable combinations thereof. For example, tactile stimuli by user 1780 on region 1790 of display 1702 may provide physical stimuli to one or more of elements 1752, 1754 and 1756, which may each be in active states including combinations of net displacement and high frequency vibration. A control system coupled to elements 1752, 1754 and 1756 may detect the physical stimuli using any suitable processing equipment or combination of processing equipment (e.g., signal input 662 and demodulator 660 of FIG. 6). In some embodiments, one or more elements of one or more arrays may each be in particular activated states, which may form topological features on display 1702. For example, in some embodiments, one or more elements of one or more arrays may each be in particular activated states and display 1702 may include one more topological features (e.g., raised buttons, contour map, moving raised cursor).

In some embodiments, tiered haptic systems may provide analog response to a particular stimuli. For example, in some embodiments, a user (e.g., user 1680, user 1780) may press on a display screen (e.g., display screen 1602, display screen 1702). A control system of a tiered haptic system may determine the amount of pressure, force, displacement, or other physical response associated with the user stimuli. For example, a tiered haptic system may distinguish between relatively light contact and a relatively heavy contact on the screen surface. In some embodiments, a tiered haptic system may perform particular tasks depending on the physical response of the stimuli.

In some embodiments, tiered haptic systems (e.g., tiered haptic system 1600 of FIG. 16, tiered haptic system 1700 of FIG. 17) may use regenerative power management. For example, tactile stimuli from a user (e.g., user 1780) may include applying mechanical work against one or more shape change elements (e.g., element 1752, element 1754, element 1756). Shape change elements which receive tactile stimuli may convert the applied mechanical work into electrical work (i.e., current and voltage), which may be transmitted by control leads to any suitable power control system. In some embodiments, shape change elements (e.g., elements 1752, 1754 and 1756) may be piezoelectric elements. Mechanical work may be converted to electrical work via the piezoelectric effect. In some embodiments, regenerative power management may prolong battery life by recovering energy supplied by a user or other tactile stimulus.

Illustrative embodiments of embedded haptic systems in accordance with the present disclosure will be discussed further in the context of illustrative FIGS. 18 and 19. In some embodiments, all functions and options related to haptic controls and systems known in the art may be available to embedded haptic systems. Although illustrative FIGS. 18-19 show isolated embedded haptic systems, it will be understood that the embedded haptic systems may be included in any suitable user device (e.g., user device 900 of FIG. 9) or haptic control system.

Figure 18:
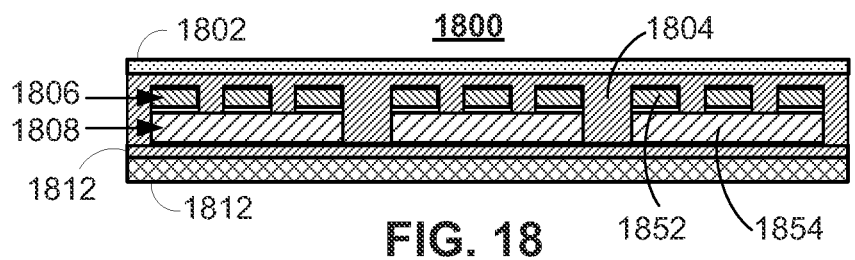
FIG. 18 shows an illustrative cross-sectional view of an embedded haptic system with a flat display in accordance with some embodiments of the present disclosure.
Figure 19:
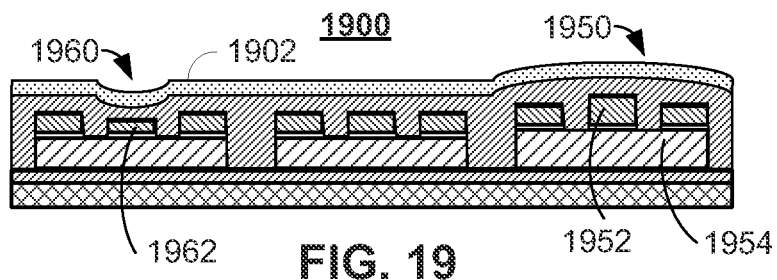
FIG. 19 shows an illustrative cross-sectional view of an embedded haptic system with a contoured display in accordance with some embodiments of the present disclosure.

FIG. 18 shows an illustrative partial cross-sectional view of embedded haptic system 1800 in accordance with some embodiments of the present disclosure. Embedded haptic system 1800 may include display screen 1802 (e.g., OLED display screen), elastic sheets 1804 and 1810, shape change element arrays 1806 and 1808, substrate 1812, any other suitable components, or any suitable combinations thereof. Embedded haptic system 1800 may include one or more elastic sheets which may include sunken reliefs, holes (e.g., blind, through, tapered), any other suitable recess or any suitable combination thereof, arranged in any suitable arrangements (e.g., patterned, random). For example, elastic sheet 1804 may include shape change element array 1806 as embedded elements, positioned in blind cutouts of substantially the same size and shape of the elements. Shape change element array 1808 may also be embedded in elastic sheet 1804, as shown in FIG. 18. Any suitable number of arrays of shape change elements may be included in any particular elastic sheet. In some embodiments, for example, a single elastic sheet may include a single array of shape change elements. The recesses of elastic sheet 1804 may be any suitable shape such as, for example, cylindrical, conic, normal prismatic with any suitable base, normal pyramidal with any suitable base, channels, troughs, any other suitable shape, or any suitable combination thereof. In some embodiments, a particular recess may include more than shape change element of the same array. For example, in some embodiments, a channel shaped recess may house multiple shape change elements along the length of the channel. Any suitable arrangement of recess, with any suitable shape or size, may be used by the embedded haptic system.

In some embodiments, elastic sheet 1810 may be included in embedded haptic system 1800. For example, elastic sheet 1810 may include control leads, which may be used to activate one or more shape change elements in one or more arrays, on one or more surfaces adjacent to the shape change elements. Rigid substrate 1812 may be included in embedded haptic system 1800, in some embodiments. In some embodiments, a rigid frame may be included in embedded haptic system 1800.

In some embodiments, display screen 1802 and adjacent elastic sheet 1804 may form an "elastic screen sheet". The elastic screen sheet may provide a visual, tactile, or both, interface with which a user may interact. In some embodiments, an elastic screen sheet may include only display screen 1802. In some embodiments, an elastic screen sheet may include only elastic sheet 1804. Embedded haptic systems may include any suitable number of elastic screen sheets, in any suitable arrangement, in accordance with the present disclosure.

In some embodiments, one or more shape change elements of one or more arrays may be in an activated state at a given time. For example, in some embodiments, elements 1852 and 1854 may, for example, be in a high frequency (e.g., substantially undetectable to a user) vibratory active state. Elements other than elements 1852 and 1854 may each be substantially un-activated or in any suitable activated state. In some embodiments, embedded haptic system 1800 may receive tactile stimuli on display screen 1802 such as, for example, contact from user motion. For example, in some embodiments, display 1802 may receive tactile stimulus such as, for example, tapping, multiple tapping, pressing, swiping, any other screen contact mode or any suitable combinations thereof. In some embodiments, embedded haptic system 1800 may receive tactile stimuli on multiple regions concurrently (e.g., contact in more than one region). In some embodiments, tactile stimuli received at any suitable region on display screen 1802 may provide physical stimuli to one or more of elements 1852, 1854, any other suitable elements or any suitable combinations thereof. For example, tactile stimuli by a user on display 1802 may provide physical stimuli to one or more of elements 1852 and 1854, which may be in a high frequency vibratory activated state. A control system coupled to elements 1852 and 1854 may detect the physical stimuli using any suitable processing equipment or combination of processing equipment (e.g., signal input 662 and demodulator 660 of FIG. 6). In some embodiments, one or more elements of one or more arrays may each be in particular activated states, which may or may not cause substantial deformation or contouring of display 1802. For example, in some embodiments, one or more elements of one or more arrays may each be in particular activated states (e.g., high frequency vibration) and display 1802 may be substantially flat.

FIG. 19 shows an illustrative partial cross-sectional view of embedded haptic system 1900 in accordance with some embodiments of the present disclosure. In some embodiments, activated tiered haptic system 1900 may correspond to a particular activated state of embedded haptic system 1800, which may include one or more topological features (e.g., raised buttons, moving raised cursor). Embedded haptic system 1900 may include display screen 1902, elastic sheets, shape change element arrays, a substrate, any other suitable components, or any suitable combinations thereof. In some embodiments, display screen 1902 may correspond to a contoured state of display screen 1802 of FIG. 18. Embedded haptic system 1900 may include one or more elastic sheets which may include sunken reliefs, holes (e.g., blind, through, tapered), any other suitable recess or any suitable combination thereof, arranged in any suitable arrangements (e.g., patterned, random). For example, elastic sheet 1904 may correspond substantially to a deformed or contoured state of elastic sheet 1804, in which one or more elements of one or more arrays may be in a particular activated state.

In some embodiments, topological features such as, for example, raised button 1950 and depression 1960 may be formed on display screen 1902. Topological features such as raised button 1950 may be formed by activation of one or more shape change elements such as, for example, elements 1952 and 1954. Element 1954 may correspond to an element in array 1806 of FIG. 18, and element 1952 may correspond to an element in array 1808 of FIG. 18. In some embodiments, one or more elements of the same array (e.g., array 1806) as a particular activated element (e.g., element 1852) may not be substantially activated at a concurrent time. Illustrative depressed topological feature 1960 may be formed by activation of one or more shape change elements such as, for example, element 1962. In some embodiments, depressed features may be formed by actuating one or more shape change elements with a preferred direction substantially parallel to the plane of display screen 1902. In some embodiments, depressed features may be formed by actuating one or more shape change elements with a preferred direction substantially normal to the plane of display screen 1902. For example, shape change element 1962 may expand laterally parallel to display screen 1902, or contract normal to display screen 1902 to form depression 1960.

In some embodiments, embedded haptic system 1900 may receive tactile stimuli on display screen 1902 such as, for example, from a user finger contacting display screen 1902. Any suitable user motion may provide tactile stimulus such as, for example, tapping, multiple tapping, pressing, swiping, any other screen contact mode or any suitable combinations thereof. In some embodiments, embedded haptic system 1900 may receive tactile stimuli on multiple regions concurrently. In some embodiments, tactile stimuli received on display screen 1902 may provide physical stimuli to one or more shape change elements. For example, tactile stimuli by a user to feature 1950 on display 1902 may provide physical stimuli to one or more of elements 1952 and 1954, which may each be in active states including combinations of net displacement and high frequency vibration. A control system coupled to elements 1952 and 1954 may detect the physical stimuli using any suitable processing equipment or combination of processing equipment (e.g., signal input 662 and demodulator 660 of FIG. 6). In some embodiments, one or more elements of one or more arrays may each be in particular activated states, which may form topological features on display 1902. For example, in some embodiments, one or more elements of one or more arrays may each be in particular activated states and display 1902 may include one more topological features (e.g., raised buttons, depressions, contour map, moving raised cursor).

Illustrative embodiments of combined tiered-embedded haptic systems in accordance with the present disclosure will be discussed further in the context of illustrative FIGS. 20 and 21. In some embodiments, all functions and options related to haptic controls and systems known in the art may be available to tiered-embedded haptic systems. Although illustrative FIGS. 20-21 show isolated haptic systems, it will be understood that the haptic systems may be included in any suitable user device (e.g., user device 900 of FIG. 9) or haptic control system.

Figure 20:
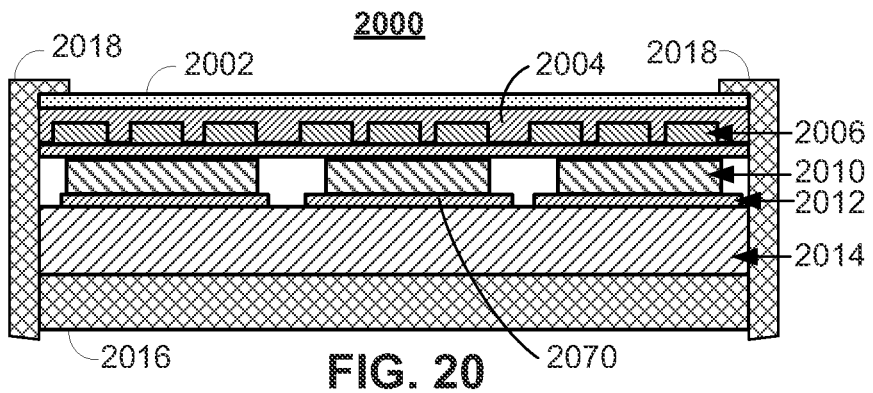
FIG. 20 shows an illustrative cross-sectional view of an embedded-tiered haptic system with a flat display in accordance with some embodiments of the present disclosure.
Figure 21:
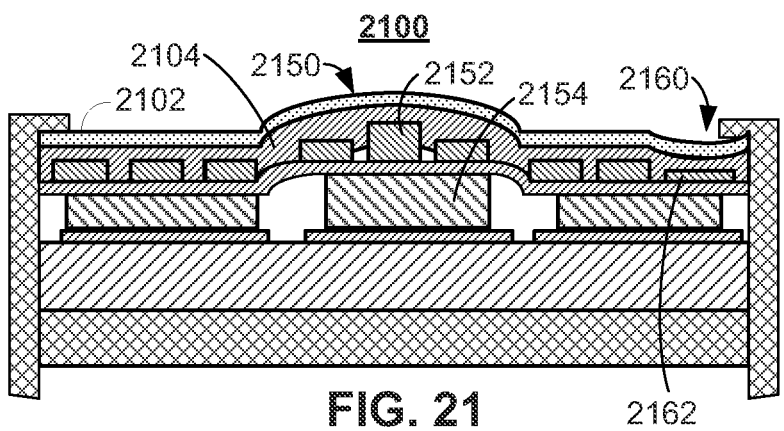
FIG. 21 shows an illustrative cross-sectional view of an embedded-tiered haptic system with a contoured display in accordance with some embodiments of the present disclosure.

FIG. 20 shows an illustrative partial cross-sectional view of tiered-embedded haptic system 2000 in accordance with some embodiments of the present disclosure. Tiered-embedded haptic system 2000 may include flexible display screen 2002 (e.g., OLED display screen), elastic sheets 2004, 2008 and 2012, shape change element arrays 2006, 2010 and 2014, substrate 2016, frame 2018, any other suitable component, or any suitable combinations thereof. In some embodiments, display screen 2002, elastic sheets 2004, 2008 and 2012, shape change element arrays 2006, 2010 and 2014, and substrate 2016 may be positioned substantially parallel to each other as shown in FIG. 20. In some embodiments, display screen 2002 may include a protective cover of any suitable substantially transparent material. In some embodiments, display screen 2002 may be segmented or partitioned such that display screen 2002 includes one or more smaller screens.

In some embodiments, elastic sheet 2004 may be positioned substantially parallel to, and in contact with, display screen 2002. In some embodiments, the elements of array 2006 may be embedded in elastic sheet 2004. Elastic sheet 2004 may be adhered to display screen 2002 in some embodiments. Elastic sheet 2004 may cushion (e.g., reduce impact to) display 2002 from actuation of one or more elements in arrays 2006, 2010, or 2014, or any combination thereof. Arrays 2006, 2010, and 2014 may each include any combination of suitable shape change elements such as, for example, piezoelectric elements, electroactive polymer elements, any other suitable shape change elements or any suitable combination thereof. The arrangement of FIG. 20 is illustrative, and any suitable collection of shape change elements may be included in an array. Tiered-embedded haptic system 2000 may include one or more elastic sheets, which may include embedded shape change elements. The stack of elastic sheets 2004, 2008 and 2012, and arrays 2006, 2010 and 2014 may, in some embodiments, include fewer or more elastic sheets and arrays. For example, in some embodiments, a stack of three arrays may be used. In a further example, in some embodiments, a stack of two arrays, in which both arrays may be embedded in elastic sheets may be used. Any suitable combination of components may be included in tiered-embedded haptic system 2000. Elastic sheet 2012 is shown illustratively in FIG. 20 as being non-contiguous. In accordance with the present disclosure, any elastic sheet may be contiguous, non-contiguous, perforated, or any other suitable arrangement or any suitable combinations thereof.

Rigid substrate 2016 may be coupled to one or more elastic sheets, or one or more elements included in one more arrays. In some embodiments, an elastic sheet may be positioned between array 2014 and substrate 2016. In some embodiments, a non-elastic sheet may be positioned between array 2014 and substrate 2016. Frame 2018 may be included in tiered-embedded haptic system 2000, in some embodiments. Frame 2018 may impart rigidity, maintain component positions, serve as a mount for control couplings, any other suitable structural function or any suitable combinations thereof. In some embodiments, frame 2018 and substrate 2016 may be portions of chassis or other structural component. In some embodiments, frame 2018 and substrate 2016 may be a single component of suitable shape and size.

In some arrangements, electronically conductive material may form one or more conductive paths on one or more surfaces of elastic sheets 2004, 2008 and 2012. In some embodiments, conductive paths may correspond to control leads. Each shape change element of each array may be controlled by a suitable control system (e.g., control system 650 of FIG. 6, processing equipment 802 of FIG. 8). In some embodiments, actuation of one or more shape change elements may impart motion, displacement, force, any other suitable physical response or any combination thereof, to another shape change element in the same array or a different array. The control system may monitor sent and received control signals for both the actuated elements and responding elements. The control system may control each shape change element separately, in groups, or as a whole.

FIG. 21 shows an illustrative partial cross-sectional view of tiered-embedded haptic system 2100 in accordance with some embodiments of the present disclosure. In some embodiments, activated tiered-embedded haptic system 2100 may correspond to a particular activated state of tiered-embedded haptic system 2000, which may include one or more topological features (e.g., raised buttons, depressions, moving raised cursor). Tiered-embedded haptic system 2100 may include display screen 2102, elastic sheets, shape change element arrays, a substrate, any other suitable components, or any suitable combinations thereof. In some embodiments, display screen 2102 may correspond to a contoured state of display screen 2002 of FIG. 20. Tiered-embedded haptic system 2100 may include one or more elastic sheets which may include sunken reliefs, holes (e.g., blind, through, tapered), any other suitable recess or any suitable combination thereof, arranged in any suitable arrangements (e.g., patterned, random). For example, elastic sheet 2104 may correspond substantially to a deformed or contoured state of elastic sheet 2004, in which one or more elements of one or more arrays may be in a particular activated state.

In some embodiments, topological features such as, for example, raised button 2150 and depression 2160 may be formed on display screen 2102. Topological features such as raised button 2150 may be formed by activation of one or more shape change elements such as, for example, elements 2152 and 2154. Element 2154 may correspond to an element in array 2010 of FIG. 20, and element 2152 may correspond to an element in array 2006 of FIG. 20. In some embodiments, one or more elements of the same array as a particular activated element may not be substantially activated at a concurrent time. Illustrative depressed topological feature 2160 may be formed by activation of one or more shape change elements such as, for example, element 2162.

In some embodiments, tiered-embedded haptic system 2100 may receive tactile stimuli on display screen 2102 such as, for example, from a user finger contacting display screen 2102. Any suitable user motion may provide tactile stimulus such as, for example, tapping, multiple tapping, pressing, swiping, any other screen contact mode or any suitable combinations thereof. In some embodiments, embedded haptic system 2100 may receive tactile stimuli on multiple regions concurrently. In some embodiments, tactile stimuli received on display screen 2102 may provide physical stimuli to one or more shape change elements. For example, tactile stimuli by a user to feature 2150 on display 2102 may provide physical stimuli to one or more of elements 2152 and 2154, which may each be in active states including combinations of net displacement and high frequency vibration. A control system coupled to elements 2152 and 2154 may detect the physical stimuli using any suitable processing equipment or combination of processing equipment (e.g., signal input 662 and demodulator 660 of FIG. 6). In some embodiments, one or more elements of one or more arrays may each be in particular activated states, which may form topological features on display 2102. For example, in some embodiments, one or more elements of one or more arrays may each be in particular activated states and display 2102 may include one more topological features (e.g., raised buttons, depressions, moving raised cursor).

In some embodiments, haptic systems 1800-2100 shown in FIGS. 18-21, respectively, may use regenerative power management. For example, tactile stimuli may include applying mechanical work against one or more shape change elements, which may convert the applied mechanical work (e.g., user applying force and displacement to a shape change element) into electrical work (i.e., current and voltage), which may be transmitted by control leads to any suitable power control system. In some embodiments, regenerative power management may prolong battery life by recovering energy supplied by a user or other tactile stimulus.

Figure 22:
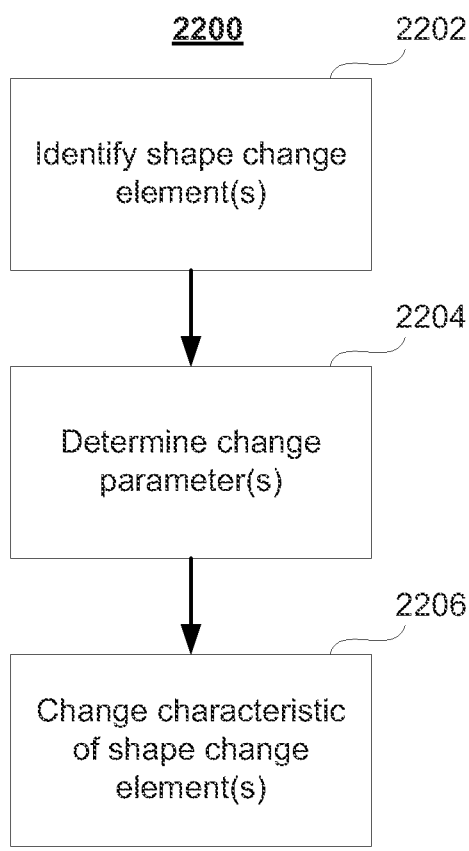
FIG. 22 is a flow diagram of illustrative steps for providing haptic feedback in accordance with some embodiments of the present disclosure.

Shown in FIG. 22 is flow diagram 2200 which includes illustrative steps for providing haptic feedback in accordance with some embodiments of the present disclosure. Step 2202 may include identifying one or more shape change elements, which may be included in one or more arrays. In some embodiments, identifying a shape change element may include, for example, receiving a signal or change in signal from a shape change element (e.g., in response to a tactile stimulus). In some embodiments, identifying a shape change element may be performed by any suitable processing equipment executing software commands. Step 2204 may include determining one or more change parameters associated with one more characteristics (e.g., size, vibration mode) of the identified shape change elements. Change parameters may include activation mode, activation timing, activation scheduling, activation details (e.g., displacement, force, pressure), any other suitable parameters, or any combinations thereof. In some embodiments, for example, determining change parameters may be performed using processing equipment which may execute software commands. Step 2206 may include making changes to one or more characteristics of one or more shape change elements (e.g., activating one or more shape change elements). Step 2206 may be performed using any suitable processing equipment.

In some embodiments, a haptic system may detect a stimuli at a particular location on a display screen by receiving a signal or change in signal from one or more shape change elements. The haptic system may identify the one or more shape change elements as having received stimulus. In response to the stimulus, for example, the haptic system may determine that one or more shape change elements should be activated in a particular state (e.g., compound net displacement and vibration). The haptic system may activate one or more of the shape change elements, using suitable processing equipment, in accordance with the determined activation state.

In some embodiments, for example, processing equipment may identify one or more shape change elements in one or more arrays based on software commands (e.g., independent of tactile stimulus). The processing equipment may determine one or more activated states of the one or more shape elements based on software commands. The processing equipment may activate the one or more identified shape change elements in accordance with the determined activated states by sending suitable signals over suitable control leads.

Any of the steps of flow diagram 2200 may be rearranged, omitted, appended, or otherwise modified without departing from the present disclosure. For example, in some embodiments, steps 2202 and 2204 may be reversed. In some embodiments, processing equipment may determine a particular activated state and then may identify one or more shape change elements of one or more arrays to activate in accordance with the determined activated state.

Figure 23:
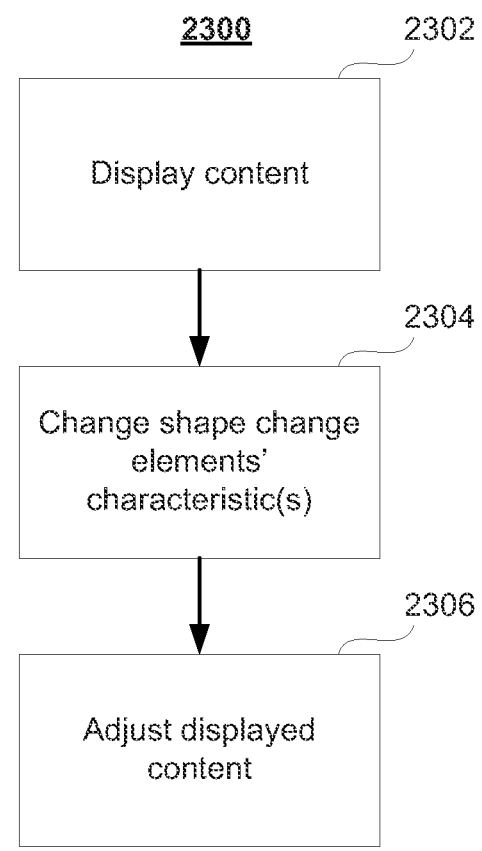
FIG. 23 is a flow diagram of illustrative steps for altering displayed content in accordance with some embodiments of the present disclosure.

Shown in FIG. 23 is flow diagram 2300 which includes illustrative steps for altering a displayed graphic in accordance with some embodiments of the present disclosure. Step 2303 may include displaying a graphic on a suitable elastic screen sheet (e.g., displaying a picture on a display screen). Step 2304 may include making changes to one or more characteristics (e.g., vibration mode, shape) of one or more shape change elements. Step 2306 may include adjustment of displayed content. In some embodiments, one or more image processing techniques (e.g., to compensate for a contoured display surface) may be used to adjust the displayed content.

In some embodiments, haptic systems may map graphics onto contoured screen features. For example, a particular graphic (e.g., video clip) may be displayed on the display screen of a particular user device (e.g., user device 800 of FIG. 8, user device 900 of FIG. 9) as shown by step 2302. The display screen may then undergo deformation (e.g., contouring), as shown by step 2304. The user device may use image processing techniques to alter the displayed graphic in response to the screen contouring, as shown by step 2306.

For example, in some embodiments, a contour elevation map with text annotations may be displayed on a display screen of a user device. A user device may contour the display screen, by activating one or more shape change elements, to correspond to the elevation at a particular region on the contour map. The user device may alter the display to compensate for the contoured surface by stretching, compressing, moving, rotating, warping, curving or otherwise altering the displayed graphic (e.g., contour map with text annotations).

In a further example, in some embodiments, a raised button may be formed on the screen surface. Graphics displayed near the edges of the raised button may be displayed at an angle relative to a user's viewing direction. The user device may, in some embodiments, display the graphics in a different location, in an different form, or any other display alteration. Image processing techniques such as, for example, Euclidian transformations (e.g., translation, rotation), image morphing, feature detection, stereoscopy (e.g., 3-D imaging), rendering (e.g., shading, texture mapping), any other suitable image processing techniques or computer graphic techniques, or any suitable combinations thereof may be used by a user device to adapt displayed graphics to contoured features.

In some embodiments, a user device may alter the display on or near a surface feature by coloring, mapping, warping, shading, or otherwise distinguishing the region of the display corresponding to the contoured feature. For example, in some embodiments, a display screen may feature a raised button. The user device may display a particular color or pattern, or other graphic on the region of the display corresponding to the particular raised button. In some embodiments, the user device may shade a portion of the surrounding display to further distinguish the raised feature.

Any of the steps of flow diagram 2300 may be rearranged, omitted, appended, or otherwise modified without departing from the present disclosure. In some embodiments, a display screen may be contoured without displaying a graphic prior to contouring. For example, in some embodiments, steps 2302 and 2304 may be reversed. A display screen may contoured be activating one or more shape change elements, and a graphic may then be displayed on the contoured display screen. In a further example, step 2302 may be omitted, and only steps 2304 and 2306 may be performed (e.g., a graphic is modified prior to display on a contoured display screen). The disclosed haptic system may apply any suitable image processing techniques or combination of techniques to adapt the displayed graphic to the display screen.

It will be understood that various directional and orientational terms such as "horizontal" and "vertical," "top" and "bottom" and "side," "length" and "width" and "height" and "thickness," "inner" and "outer," "internal" and "external," and the like are used herein only for convenience, and that no fixed or absolute directional or orientational limitations are intended by the use of these words. For example, the components and elements of this disclosure may have any desired orientation. If reoriented, different directional or orientational terms may need to be used in their description, but that will not alter their fundamental nature as within the scope and spirit of this disclosure.

It will also be understood that the previously discussed embodiments and examples are only illustrative of aspects of the disclosed haptic systems, and are not presented for purposes of limitation. It will be understood that various tactile feedback techniques may be made available to the user and examples included herein are solely for convenience. Those skilled in the art will appreciate that the disclosed haptic systems may be practiced by other than the described embodiments, and the disclosure is limited only by the claims that follow.

What is claimed is:

1. A haptic control system comprising:
a substantially rigid substrate;
an elastic screen sheet substantially parallel to the rigid substrate;
a first plurality of shape change elements arranged in a first single layer array substantially parallel to and between the substrate and the elastic screen sheet;
a second plurality of shape change elements arranged in a second single layer array substantially parallel to the first single layer array, wherein the second array is between the first single layer array and the elastic screen sheet;
an intermediate elastic sheet substantially parallel to the rigid substrate, wherein the intermediate elastic sheet is positioned between the first single layer array and the second single layer array; and
control circuitry coupled to the first single layer array and the second single layer array; wherein:
the first plurality of shape change elements deforms a first region of the elastic screen sheet upon receipt of a first electrical signal; and
the second plurality of shape change elements deforms a second region of the elastic screen sheet upon receipt of a second electrical signal.

2. The system of claim 1, wherein the elastic screen sheet is a display.

3. The system of claim 1, wherein the elastic screen sheet comprises a flexible organic light emitting diode display sheet.

4. The system of claim 1, wherein the elastic screen sheet comprises at least one control lead, wherein the at least one control lead is coupled to at least one shape change element.

5. The system of claim 1, wherein the first single layer array and the second single layer array are rigidly affixed to the intermediate elastic sheet.

6. The system of claim 1, wherein at least one of the plurality of shape change elements of the first single layer array are rigidly affixed to at least one of the shape change elements of the second single layer array.

7. The system of claim 1, wherein the first plurality of shape change elements are of a first size and the second plurality of shape change elements are of a second size.

8. The system of claim 1, wherein the first plurality of shape change elements and the second plurality of shape change elements are of substantially the same size.

9. The system of claim 1, wherein at least one of the first plurality of shape change elements and the second plurality of shape change elements comprises a piezoelectric element.

10. The system of claim 1, wherein at least one of the first plurality of shape change elements and the second plurality of shape change elements comprises a shape memory polymer.

11. A haptic control system comprising:
an elastic screen sheet, wherein the elastic screen sheet is substantially flat on a first surface and contains a plurality of sunken reliefs on a second surface, the second surface opposite the first surface;
a substantially rigid substrate substantially parallel to the elastic screen sheet;

a plurality of shape change elements arranged in the sunken reliefs, wherein the shape change elements are positioned between the elastic screen sheet and the substrate; and control circuitry coupled to the plurality of shape change elements;

wherein:

the plurality of shape change elements are rigidly affixed to the elastic screen sheet; and the substantially rigid substrate is at least partially affixed to the second surface.

12. The system of claim 11, wherein the elastic screen sheet is a display.

13. The system of claim 11, wherein at least one of the plurality of shape change elements comprises piezoelectric element.

14. The system of claim 11, wherein at least one of the shape change elements of the plurality of shape change elements is of a different size than at least one other shape change element of the plurality of shape change elements.

15. A method for providing haptic feedback using a haptic system that comprises a stack of first and second layers of arrays of shape change elements, an elastic screen sheet positioned above the first and second layers of arrays, and an intermediate elastic sheet positioned between the first and second layers of arrays, the method comprising:

identifying a first shape change element of the first layer and a second shape change element of the second layer to be changed;

determining a first change to be made to a characteristic of the first shape change element and a second change to be made to a characteristic of the second shape change element; and causing a first control signal to be applied to the first shape change element and a second control signal to be applied to the second shape change element the first control signal and the second control signal corresponding to the first change and the second change, respectively.

16. The method of claim 15, further comprising:

displaying content on the surface of the elastic screen sheet opposite the layers of arrays.

17. The method of claim 16, wherein the displaying content further comprises using an image processing technique to adapt the displayed content to a contoured feature of the elastic screen sheet.

18. The method of claim 15, wherein the first control signal and the second control signal are applied at substantially the same time.

19. The method of claim 15, wherein the identifying the first and second shape change elements is in response to a particular stimulus, the method further comprising: storing energy corresponding to the particular stimulus in an energy storage device.

* * * * *